United States Patent
Yamazaki et al.

(10) Patent No.: US 6,506,636 B2
(45) Date of Patent: Jan. 14, 2003

(54) METHOD OF MANUFACTURING A SEMICONDUCTOR DEVICE HAVING A CRYSTALLIZED AMORPHOUS SILICON FILM

(75) Inventors: Shunpei Yamazaki, Tokyo (JP); Taketomi Asami, Kanagawa (JP); Mitsuhiro Ichijo, Kanagawa (JP); Toru Mitsuki, Kanagawa (JP); Yoko Kanakubo, Kanagawa (JP)

(73) Assignee: le;.5qSemiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/851,492

(22) Filed: May 9, 2001

(65) Prior Publication Data

US 2002/0013022 A1 Jan. 31, 2002

(30) Foreign Application Priority Data

May 12, 2000 (JP) ........................................ 2000-140816

(51) Int. Cl.⁷ ................................................ H01L 21/00
(52) U.S. Cl. ........................ 438/149; 438/166; 438/482; 438/486
(58) Field of Search ............................ 438/30, 149–166, 438/482–491

(56) References Cited

U.S. PATENT DOCUMENTS

| | | | |
|---|---|---|---|
| 5,643,826 A | 7/1997 | Ohtani et al. | |
| 5,861,337 A | 1/1999 | Zhang et al. | |
| 6,074,901 A | 6/2000 | Ohtani et al. | |
| 6,156,997 A | * 12/2000 | Yamazaki et al. | ....... 219/121.8 |
| 6,177,302 B1 | 1/2001 | Yamazaki et al. | |
| 6,303,963 B1 | 10/2001 | Ohtani et al. | |

FOREIGN PATENT DOCUMENTS

| JP | 07-130652 A | 5/1995 |
|---|---|---|
| JP | 08-078329 A | 3/1996 |

* cited by examiner

*Primary Examiner*—H. Jey Tsai
(74) *Attorney, Agent, or Firm*—Nixon Peabody LLP; Jeffrey L. Costellia

(57) ABSTRACT

Contamination of an interface of respective films constituting a TFT due to an contaminant impurity in a clean room atmosphere becomes a great factor to lower the reliability of the TFT. Besides, when an impurity is added to a crystalline semiconductor film, its crystal structure is broken. By using an apparatus for manufacturing a semiconductor device including a plurality of treatment chambers, a treatment can be made without being exposed to a clean room atmosphere in an interval between respective treatment steps, and it becomes possible to keep the interface of the respective films constituting the TFT clean. Besides, by carrying out crystallization after an impurity is added to an amorphous semiconductor film, the breakdown of the crystal structure of the crystalline semiconductor film is prevented.

24 Claims, 19 Drawing Sheets

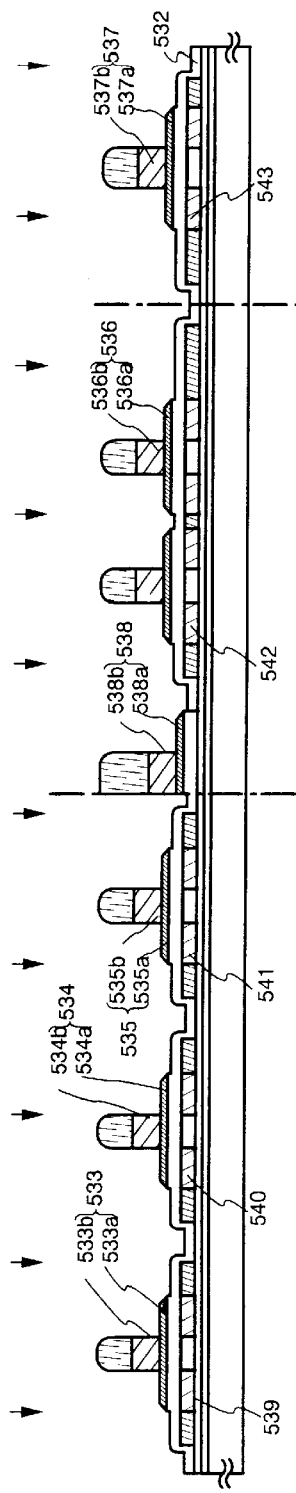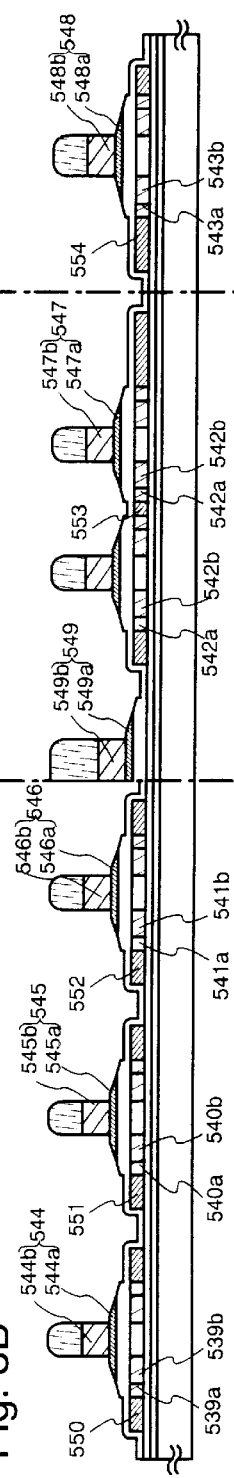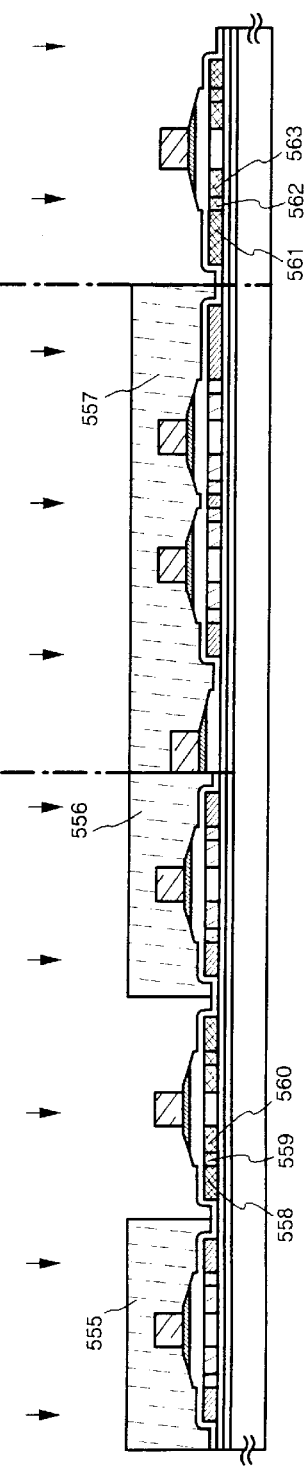

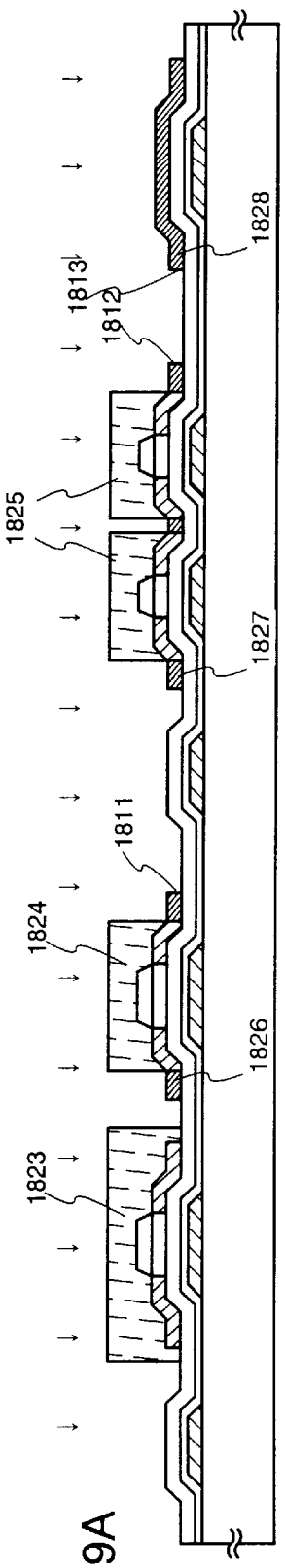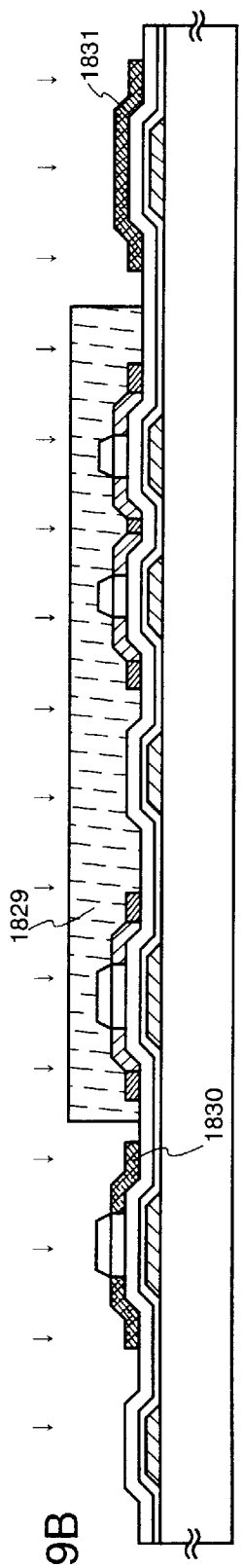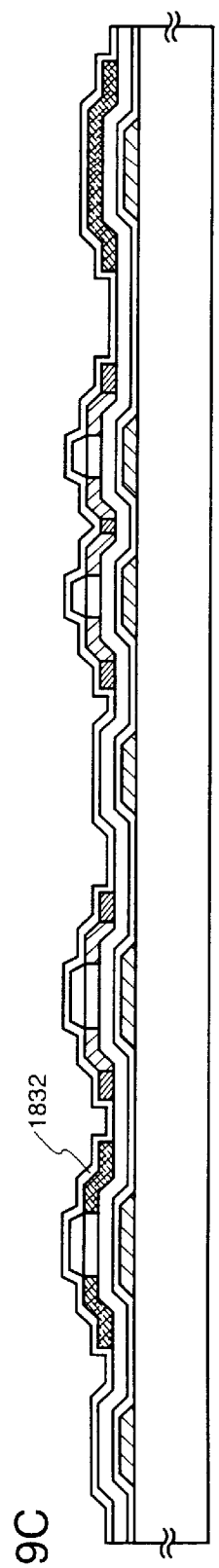

METHOD OF MANUFACTURING A SEMICONDUCTOR DEVICE HAVING A CRYSTALLIZED AMORPHOUS SILICON FILM

BACKGROUND OF THE INVENTION

1. Field of the Invention

The present invention relates to a method of manufacturing a semiconductor device, such as a thin film transistor (hereinafter referred to as a TFT), using a crystalline semiconductor film formed on a substrate. The semiconductor device fabricated by the present invention includes not only an element such as a TFT or a MOS transistor, but also a liquid crystal display device, an EL (Electro Luminescence) display device, an EC (Electro Chromic) display device, an image sensor, or the like, each including a semiconductor circuit (microprocessor, signal processing circuit, high frequency circuit, etc.) constituted by insulated gate transistors.

2. Description of the Related Art

At present, as a semiconductor element using a semiconductor film, a thin film transistor (hereinafter referred to as a TFT) is used for each integrated circuit, and is especially used as a switching element of an image display device. Further, a TFT using as an active layer a crystalline semiconductor film having higher mobility than an amorphous semiconductor film has high drive capability and is also used as an element of a driving circuit.

As a method of obtaining a crystalline semiconductor film, a thermal annealing method, a laser annealing method, or techniques disclosed in Japanese Patent Application Laid-Open No. Hei. 7-130652 and No. Hei. 8-78329 by the present assignee are well known. The technique disclosed in the publications uses a metal element (especially nickel (Ni)) for promoting crystallization of silicon to enable the formation of a crystalline silicon film having excellent crystallinity by a heat treatment at 500 to 600° C. for about 4 hours.

Reliability is regarded as most important in evaluation of a TFT. As a factor to lower the reliability, an impurity in the TFT (hereinafter, an impurity to lower the reliability of a TFT is called a contaminant impurity in the present specification) can be mentioned. The contaminant impurity is mixed in the TFT from various contaminating sources such as the air, a glass substrate, and a manufacturing apparatus. Particularly, that the contaminant impurity exists on an interface of films constituting the TFT is a great factor to damage the reliability of the TFT.

Besides, among things indicating electrical characteristics of a TFT, there is a threshold voltage (Vth). In general, there is a method of adding boron (B) as an impurity element to give a p-type into a crystalline semiconductor film in order to control the threshold voltage (Vth) of an n-channel TFT.

It is difficult to continuously conduct all steps of forming and treating respective films constituting a TFT. For example, a crystalline semiconductor film is obtained by using a method of crystallizing an amorphous semiconductor film by heat, laser light or the like. In general, a film formation apparatus and a furnace or a laser apparatus, for a heat treatment are respectively independent of each other. Besides, if a film formation apparatus is used, in which only one kind of film can be formed, though the apparatus includes a single or a plurality of film formation chambers, the surface of a substrate is exposed to a clean room atmosphere each time the film formation is made. Accordingly, it becomes necessary to provide a step of washing the surface of a film prior to a next treatment. However, the substrate is also exposed to the air atmosphere until it is put in the film formation apparatus from a washer.

A semiconductor device is generally fabricated in a clean room. In the clean room, although a filter is used to remove dirt, dust, contaminant substance or the like from the outer air to be taken in, a lot of contaminant impurities generated from the filter itself, especially boron (B) or a lot of contaminant impurities from a person working in the clean room, especially sodium (Na) exist in the clean room atmosphere. That is, the surface of the substrate is contaminated by merely exposing the substrate to the clean room atmosphere.

Besides, if an impurity is put in a regular crystal structure, the regular crystal structure is broken. That is, that the boron (B) to give a p-type is added to a crystalline semiconductor film in order to control a threshold voltage (Vth) breaks the crystal structure of the crystalline semiconductor film, and there is a possibility that the drive capability of the TFT is lowered.

SUMMARY OF THE INVENTION

An object of the present invention is to keep an interface of respective films constituting a TFT in a clean state without being contaminated by a contaminant impurity.

Another object of the present invention is to add an impurity element to give a p-type into an n-channel TFT without breaking the crystal structure of a crystalline semiconductor film.

In order to achieve the above object, the present invention is characterized in that in a film formation apparatus including a plurality of film formation chambers, steps from formation of a base film to formation of a silicon oxide film as a protective film for addition of an impurity element to give a p-type into an n-channel TFT are continuously conducted without being exposed to a clean room atmosphere. In other words, the present invention is characterized in that contamination of an interface of the respective films is prevented by using the film formation apparatus including the plurality of film formation chambers.

Besides, in order to achieve the above object, the present invention is characterized in that a washing room for removing a contaminant impurity on a surface of a film is provided for a laser apparatus, and steps from contaminant impurity removal of the surface of the film to laser annealing are continuously conducted.

In the above constitution, the contaminant impurity removal of the surface of the film is carried out in such a manner that after washing is carried out by pure water dissolving ozone therein, an acid solution containing fluorine is used to etch the surface of the film very slightly.

As means for carrying out etching very slightly, such a method is effective that a spin apparatus is used to spin a substrate, and the acid solution containing fluorine which is brought into contact with the surface of the film is scattered.

The reason why the pure water containing ozone is used is as follows:

(1) A very thin oxide film is formed on the surface of a first film by ozone, and a contaminant impurity adsorbed on the surface of the first film, together with the very thin oxide film, can be subsequently removed by using the acid solution containing fluorine.

(2) In the case where the first film is hydrophobic, the surface of the first film is changed to be hydrophilic by oxidizing the surface with ozone, and a cleaning effect is improved.

(3) A very small amount of carbide material existing in a clean room atmosphere can be removed through oxidation and decomposition by ozone.

As the acid solution containing fluorine, hydrofluoric acid, dilute hydrofluoric acid, ammonium fluoride, buffered hydrofluoric acid (mixed solution of hydrofluoric acid and ammonium fluoride), mixed solution of hydrofluoric acid and hydrogen peroxide water, or the like can be used.

Accordingly, the semiconductor device of the present invention is characterized in that a spin type washer is provided in a washing chamber, and pure water in which ozone is dissolved and an acid solution containing fluorine are used as a washing liquid, so that the contaminant impurity on the surface of the film constituting the TFT is removed.

Besides, in order to achieve the object with respect to the crystal structure breakdown, the present invention is characterized in that after boron (B) as an impurity element to give a p-type is added to an amorphous semiconductor film in an n-channel TFT, crystallization is carried out.

BRIEF DESCRIPTION OF THE DRAWINGS

In the accompany drawings:

FIGS. 8A to 8C are sectional views of the TFT of the embodiment 1;

FIGS. 19A to 19C are sectional views of the TFT of the embodiment 4; and

DETAILED DESCRIPTION OF THE PREFERRED EMBODIMENTS

Embodiment Modes of the present invention will be described with reference to FIGS. 1 to 4.

[Embodiment Mode 1]

Figure 1:
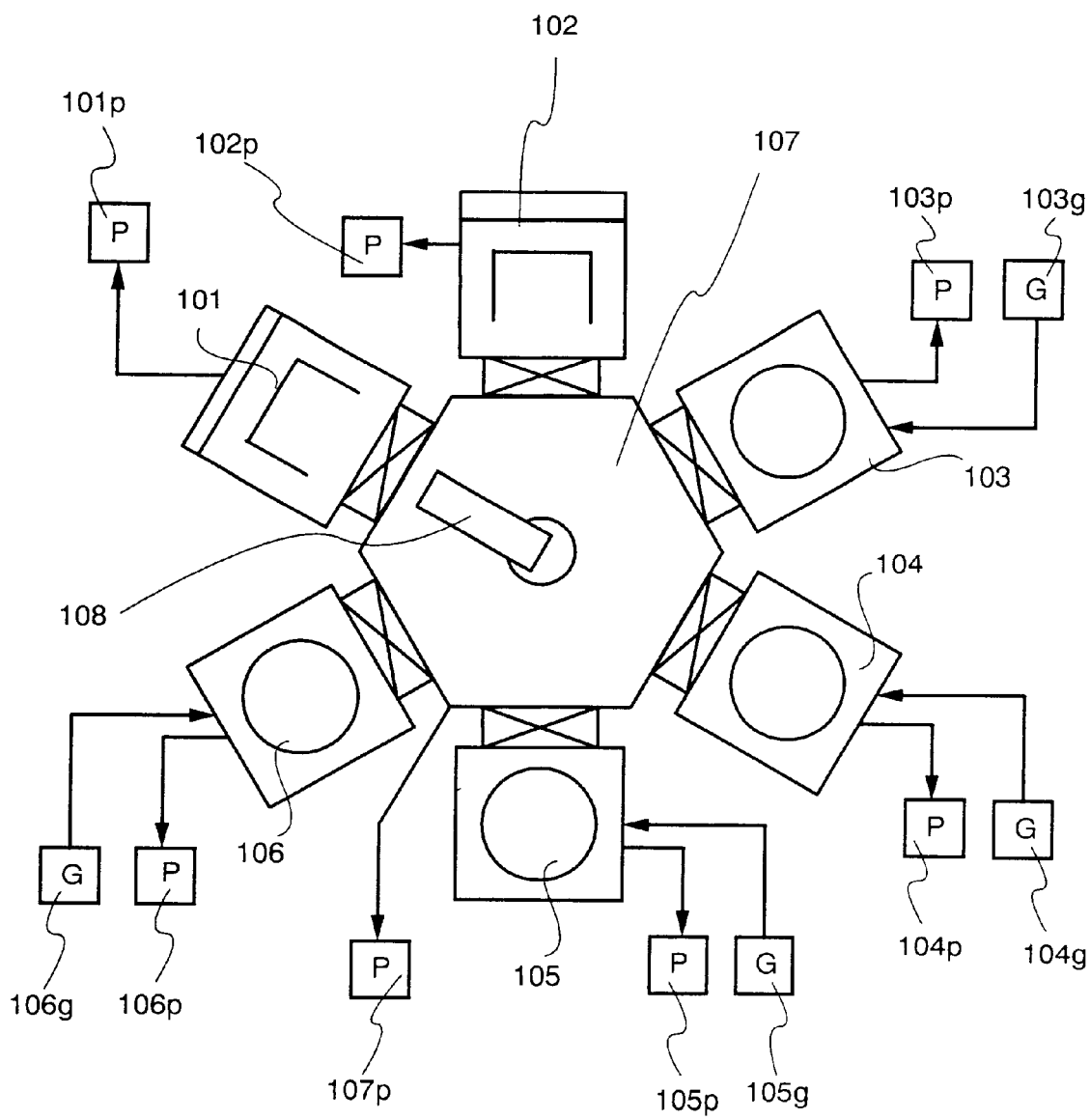
FIG. 1 is a view showing a film formation apparatus including a plurality of film formation chambers.

FIG. 1 shows a film formation apparatus including a plurality of film formation chambers. This film formation apparatus includes loader/unloader chambers 101 and 102, a transfer chamber 107, a transfer robot 108, and film formation chambers 103 to 106. Exhaust systems 101$p$, 102$p$ and 107$p$ for evacuating the respective chambers are provided for the loader/unloader chambers and the transfer chamber, and lines 103$g$ to 106$g$ for introducing gases used for film formation and exhaust systems 103$p$ to 106$p$ are provided for the film formation chambers.

The formation of respective films is carried out in the respective film formation chambers. The formation of a base film is carried out in the first film formation chamber 103, and next, the formation of an amorphous semiconductor film is carried out in the second film formation chamber 104, and next, a catalytic element for promoting crystallization of the amorphous semiconductor film is added in the third film formation chamber 105, and finally, the formation of a protective film for addition of an impurity element to give a p-type into an n-channel TFT is carried out in the fourth film formation chamber 106. As the protective film, a silicon oxide film, a silicon nitride oxide film or the like may be used.

With respect to the films formed in the respective film formation chambers, any forming means such as a plasma CVD method, a thermal CVD method, a low pressure CVD method, an evaporation method, or a sputtering method can be used.

When a heat treatment is carried out after boron (B) as the impurity element to give the p-type is added to an amorphous semiconductor film of an n-channel TFT, boron becomes a part of crystal structure of a crystalline semiconductor film and crystallization occurs, so that breakdown of the crystal structure occurring in the prior art can be prevented.

In the present invention, crystallization is made by addition of the catalytic element to the amorphous semiconductor film. Accordingly, although crystallization becomes possible by a heat treatment at 500 to 600° C., if laser annealing is further carried out, a crystallization rate is raised.

Figure 2:
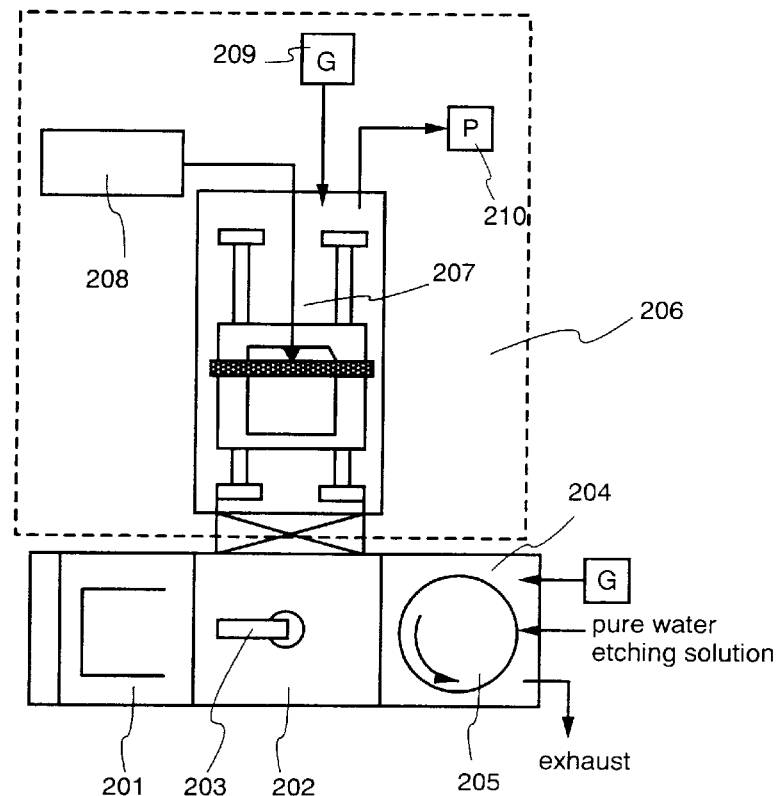
FIG. 2 is a view showing a laser apparatus with a washer.
Figure 3:
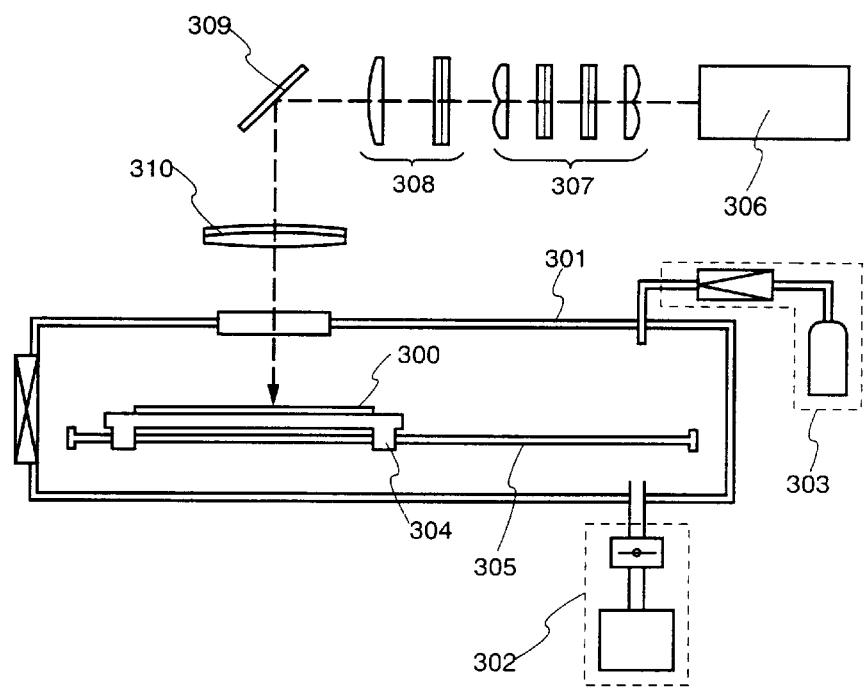
FIG. 3 is a sectional view of the laser apparatus.

FIG. 2 shows a laser apparatus with a washer. This apparatus includes a loader/unloader chamber 201, a washing chamber 204, and a laser apparatus 206. A spin type washer 205 is placed in the washing chamber 204. In the washing chamber 204, there are introduction means of a gas such as nitrogen or argon, introduction means of an etching solution and pure water, and exhaust means. The laser apparatus 206 includes a treatment chamber 207, introduction means 209 of a gas such as nitrogen or argon, exhaust means 210, a laser oscillator 208, and the like. The laser apparatus 206 is separately shown in FIG. 3. The treatment chamber 301 is provided with exhaust means 302 and gas introduction means 303. An optical system includes a beam homogenizer 307 made of a cylindrical lens array, a cylindrical lens 308, a mirror 309, a doublet cylindrical lens 310, and the like. The laser oscillator 306 and the optical system are disposed at the outside of the treatment chamber. A substrate set in the loader/unloader chamber 201 is transferred to the washing chamber 204 by the transfer robot 203 in the transfer chamber 202 and is subjected to a washing treatment. The substrate 300 subjected to the washing treatment is put on a stage 304 moving on a rail 305, and is subjected to a laser treatment. As a laser, a pulse oscillation type or continuous-wave excimer laser, a YAG laser or the like can be used. The laser treatment can be carried out under atmospheric pressure or low pressure.

The contaminant impurity in this constitution is made of one element or a plurality of elements existing in the atmosphere. Especially, the contaminant impurity is made of one element or a plurality of elements selected from B, Na, K, Mg, and Ca.

[Embodiment Mode 2]

Figure 4:
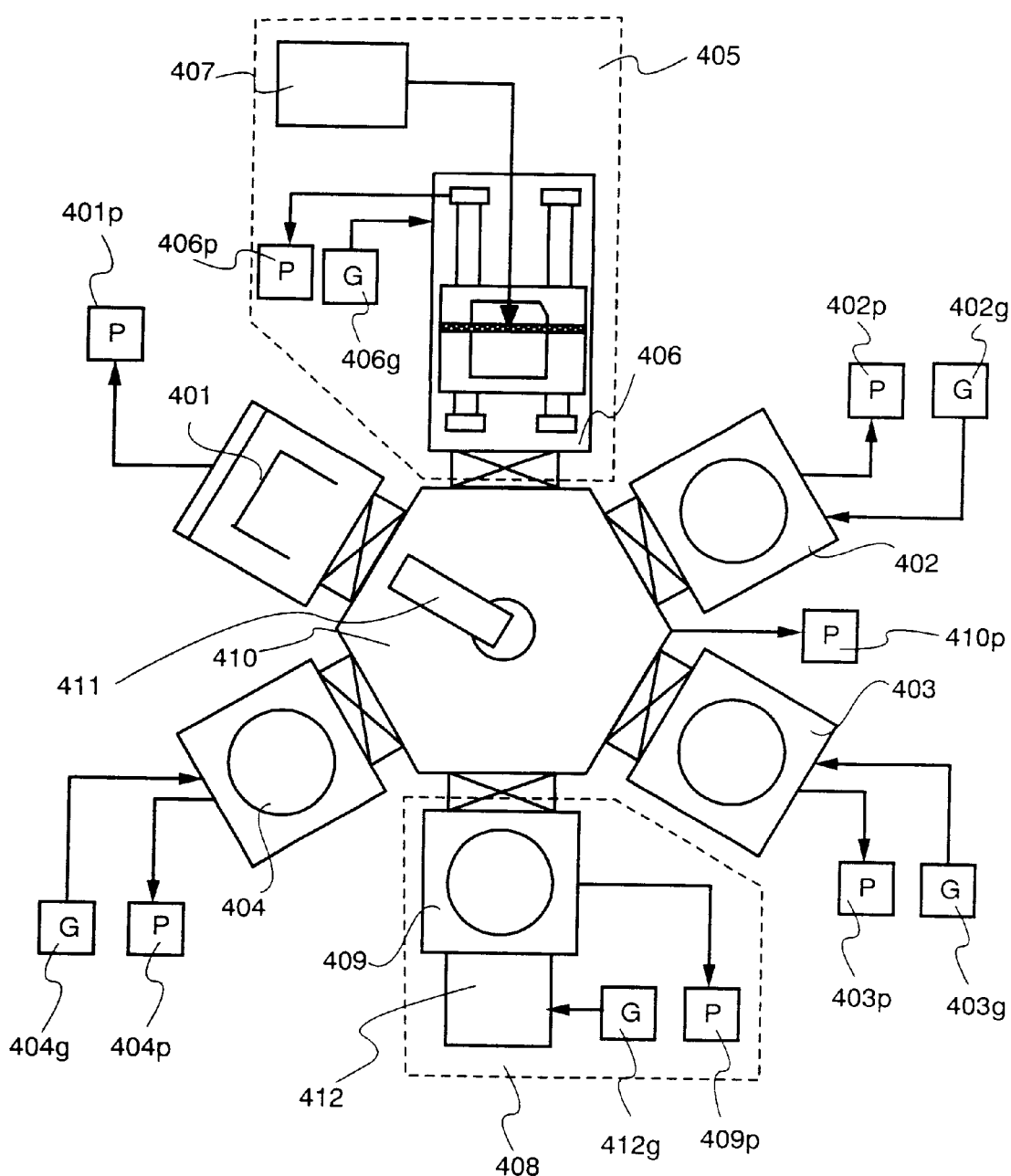
FIG. 4 is a view showing an apparatus for manufacturing a semiconductor device including a plurality of treating units.

FIG. 4 shows an apparatus for manufacturing a semiconductor device in which film formation chambers 402 to 404, a laser apparatus 405, and a doping apparatus 408 are connected with one another through a transfer chamber 410. Exhaust systems 401p and 410p for evacuating the respective chambers are provided for a loader/unloader chamber 401 and the transfer chamber 410. Lines 402g to 404g for introducing gases used for film formation and exhaust systems 402p to 404p are provided for the film formation chambers. A substrate is set in the loader/unloader chamber 401. The set substrate is transferred to the respective treatment chambers by a transfer robot 411.

First, the formation of a base film is carried out in the first film formation chamber 402. Next, an amorphous semiconductor film is formed in the second film formation chamber 403. Next, a first laser annealing is carried out by the laser apparatus 405. It is known that a doped amorphous semiconductor film is difficult to crystallize by laser annealing. Thus, the first annealing is carried out to advance crystallization to a certain degree. The laser apparatus 405 includes a treatment chamber 406, introduction means 406g of a gas such as nitrogen or argon, exhaust means 406p, a laser oscillator 407, and the like.

Next, the formation of a protective film for addition of an impurity element to give a p-type into an n-channel TFT is carried out in the third film formation chamber.

With respect to the films formed in the respective film formation chambers, any forming means such as a plasma CVD method, a thermal CVD method, a low pressure CVD method, an evaporation method, or a sputtering method can be used.

The impurity element to give the p-type is added using a doping apparatus in order to control the threshold voltage (Vth) of the n-channel TFT. The doping apparatus 408 indicates an ion doping apparatus, and includes an ion generation chamber 412, a treatment chamber 409, introduction means 412g of a gas to be used, exhaust means 409p, and the like. As the impurity element to give the p-type to a semiconductor, an element in the Group 13 of the periodic table, such as boron (B), aluminum (Al), or gallium (Ga), is known.

After the impurity is added, a second laser treatment is carried out to make crystallization by the laser apparatus without removing the protective film.

Hereinafter, although embodiments of the present invention will be described, the present invention is not particularly limited to these.

Embodiments

[Embodiment 1]

Embodiments of the present invention will be described with reference to FIGS. 5A to 5C, FIGS. 7A to 10, and FIG. 17. In this embodiment, a description will be made of a manufacturing method of simultaneously forming, on the same substrate, a pixel portion and TFTs (n-channel TFT and p-channel TFT) of a driver circuit formed in the periphery of the pixel portion, is described in detail.

As a substrate 500, a glass substrate, a quartz substrate, a ceramic substrate, or the like may be used. Also, a silicon substrate, a metallic substrate, or a stainless substrate on which an insulating film is formed may be used. A plastic substrate having heat resistance to a process temperature of this embodiment may also be used.

Figure 5A:
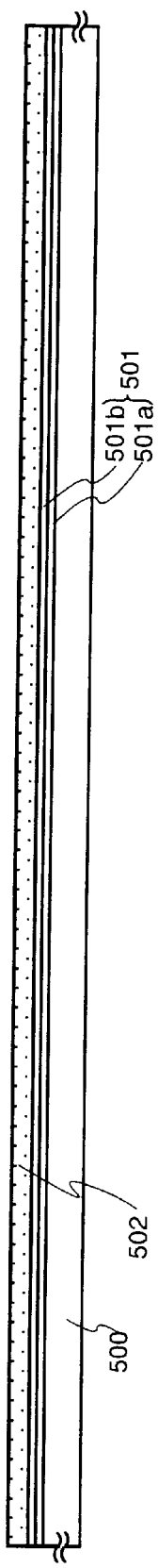
FIGS. 5A to 5C are sectional views of a TFT of embodiment 1.

Then, as shown in FIG. 5A, a base film 501 is formed from an insulating film such as a silicon oxide film, a silicon nitride film or a silicon oxynitride film on a substrate 500. In this embodiment, a two-layer structure is used as the base film 501. However, a single-layer film or a lamination structure consisting of two or more layers of the insulating film may be used. As a first layer and a second layer of the base film 501 are continuously formed in a first film formation chamber by a plasma CVD method. As a first layer of the base film 501, a silicon oxynitride film 501a is formed into a thickness of from 50 to 100 nm using $SiH_4$, $NH_3$, and $N_2O$ as reaction gases. Then, as a second layer of the base film 501, a silicon oxynitride film 501b is formed into a thickness of from 100 to 150 nm using $SiH_4$, and $N_2O$ as reaction gases.

Subsequently, an amorphous semiconductor film 502 is formed on the base film 501 in a second film formation chamber. The amorphous semiconductor film is formed into a thickness of from 30 to 60 nm. The material of the amorphous semiconductor film is not particularly limited, however, the film is preferably made of silicon, a silicon germanium ($Si_xGe_{1-x}$; x=0.01 to 2 atomic %) alloy or the like. In this embodiment, amorphous silicon film is formed by a plasma CVD method using $SiH_4$ gas.

Besides, the base film and the amorphous semiconductor film can be formed by the same method, and therefore the base film 501 and the amorphous semiconductor film 502 can be formed continuously.

Subsequently, Ni is added to the amorphous silicon film 502 in a third film formation chamber. An electrode containing Ni as a material is attached by a plasm CVD method, and plasma is erected by introducing a gas such as argon to add Ni. Of course, an extremely thin film of Ni may be formed by evaporation or sputtering.

Next, a protective film 504 is formed in a fourth film formation chamber. As the protective film, silicon oxide film, silicon oxynitride film, or the like is preferably used. When the succeeding dehydrogenation process is performed, a dense film such as a silicon oxide film is not preferably used, because hydrogen hardly penetrates therethrough. In this embodiment, TEOS (tetraethyl orthosilicate) and $O_2$ are mixed to form a silicon oxide film with a thickness of from 100 to 150 nm by a plasma CVD method.

Figure 5B:
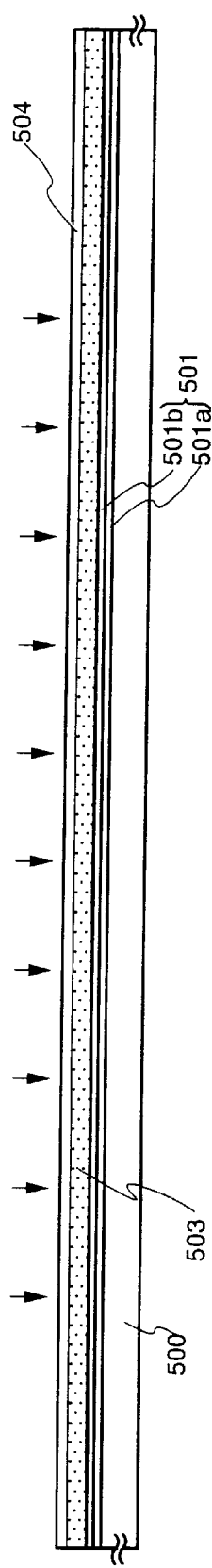

Then, to control the threshold voltage (Vth) of an n-channel TFT, an impurity element imparting p-type is added thereto (FIG. 5B). Known impurity elements imparting a p-type to a semiconductor include boron (B), aluminum (Al), gallium (Ga), etc., belonging to the Group 13 of periodic table. In this embodiment, boron (B) is added thereto.

After the addition of boron, a dehydrogenation process (500° C. for 1 hour) and a thermal crystallization process (550° C. for 4 hours) are succeedingly performed to an amorphous semiconductor film 503. Here, a known thermal crystallization process may be performed without adding a catalyst element such as Ni. Then, the silicon oxide film as the protective film is removed by using an etching solution such as fluoric acid.

Figure 5C:
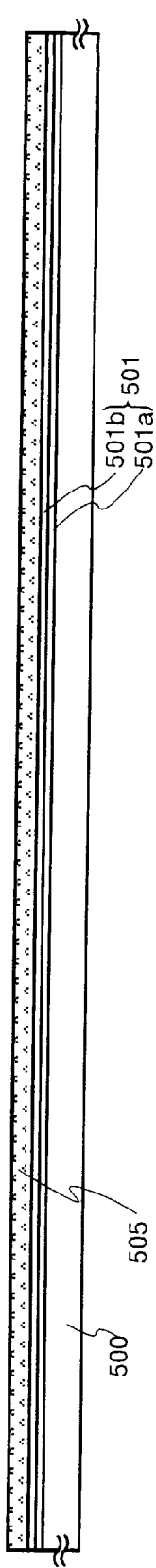

Next, washing and laser annealing are continuously performed (FIG. 5C). In this case, an acid solution containing pure water dissolving ozone therein and fluorine, is used, with the result that the contaminant impurity attached to the coated surface can be removed together with an extremely thin oxide film, which is formed upon carrying out the washing with water dissolving ozone therein. As a manufacturing method of the pure water dissolving ozone therein, there is employed a method such as electrolyzing pure water, or directly dissolving ozone gas into the pure water. Further, the concentration of ozone is preferably set as 6 mg/L or more to be used. Note that a rotation speed of a spinning apparatus or a time condition thereof is appropriately determined to an optimum condition on the basis of an area of substrate, coating material, or the like.

Laser annealing may be performed in such a manner that laser light irradiated from a laser oscillator is condensed into a linear shape by an optical system to emit it to the semiconductor film. The condition of crystallization may appropriately be selected by an operator.

A crystalline semiconductor film 505 is patterned into a desired shape, and then an island-like semiconductor layers 506 to 510 are formed by dry etching.

Then, a gate insulating film 511 for covering the island-like semiconductor layers 506 to 510 is formed. The gate insulating film 511 is formed by a plasma CVD method or a sputtering method, and the film thickness thereof is set as 40 to 150 nm using an insulating film containing silicon. The gate insulating film is not limited to the silicon oxynitride film, an another insulating film containing silicon may be formed into a single layer or a lamination structure.

Beside, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C., and discharged at a high frequency (13.56 MHz) power density of 0.5 to 0.8 W/cm². Good characteristics as the gate insulating film can be obtained in the silicon oxide film thus manufactured by subsequent thermal annealing at 400 to 500° C.

Then, on the gate insulating film 511, a first conductive film 512 (TaN) and a second conductive film (W) 513 are formed into lamination to have a film thickness of from 20 to 100 nm and 100 to 400 nm, respectively. The conductive films may be formed of an element selected from Ta, W, Ti, Mo, Al, and Cu, or an alloy material or a compound material containing the above elements as the main component. Besides, a semiconductor film typified by a polycrystalline silicon film doped with an impurity element such as phosphorus may be used. Besides, any combination may be employed such as a combination in which the first conductive film is formed of tantalum (Ta) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

In this case, if the formation of the gate insulating film 511 and the gate conductive films 512 and 513 are performed using a film formation apparatus equipped with a washing machine, contamination of the interface of films may be prevented. The similar washing method used before laser anneal treatment can be used.

Next, masks 514 to 519 consisting of resist are formed by using a photolithography method, and a first etching process for forming electrodes and wirings is carried out. In this embodiment, an ICP (inductively coupled plasma) etching method is used, in which $CF_4$, $Cl_2$, and $O_2$ are used as the etching gases, a gas flowing rate of each gas is set as 25/25/10 (sccm), and an RF (13.56 MHz) power of 500 W is applied to a coil type electrode under a pressure of 1 Pa to generate plasma. Thus the etching is performed. An RF (13.56 MHz) power of 150 W is also applied to the side of the substrate (sample stage) and a substantially negative self bias voltage is applied thereto. Based on this first etching condition, the W film is etched to make an end portion of the first conductive layer into a tapered shape.

Thereafter, the etching condition is changed into a second etching condition, and the etching is performed, without removing masks 514 to 519 consisting of resist, in which $CF_4$ and $Cl_2$ are used as the etching gases, a gas flowing rate of each gas is set as 30/30 (sccm), and an RF (13.56 MHz) power of 500 W is applied to a coil type electrode under a pressure of 1 Pa to generate plasma. Thus, the etching is performed about 30 seconds. An RF (13.56 MHz) power of 20 W is also applied to the side of the substrate (sample stage) and a substantially negative self bias voltage is applied thereto. In the second etching condition, in which $CF_4$ and $Cl_2$ are mixed, the W film and the TaN film are etched in the same degree. Note that, in order to perform the etching without leaving a residue on the gate insulating film, it is appropriate that an etching time is increased by a rate on the order of 10 to 20%.

In the above first etching process, by making the shapes of the masks consisting of resist suitable, the end portions of the first conductive layer and the second conductive layer become the tapered shape by the effect of the bias voltage applied to the substrate side. The angle of the taper portion becomes 15 to 45°. In this way, first shape conductive layers 521 to 526 consisting of the first conductive layers and the second conductive layers (the first conductive layers 521a to 526a and the second conductive layers 521b to 526b) are formed by the first etching process. Reference numeral 520 denotes a gate insulating film, and regions which are not covered with the first shape conductive layers 521 to 526 are etched by about 20 to 50 nm so that thinned regions are formed.

Figure 7A:
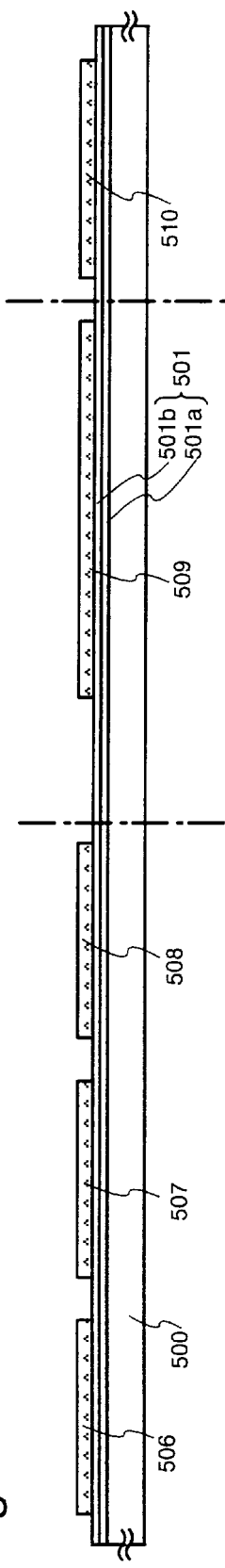
FIGS. 7A to 7C are sectional views of the TFT of the embodiment 1.
Figure 7B:
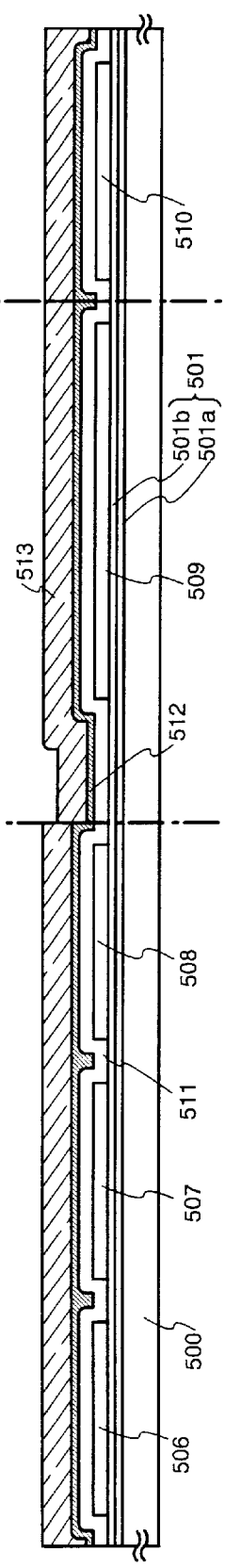
Figure 7C:
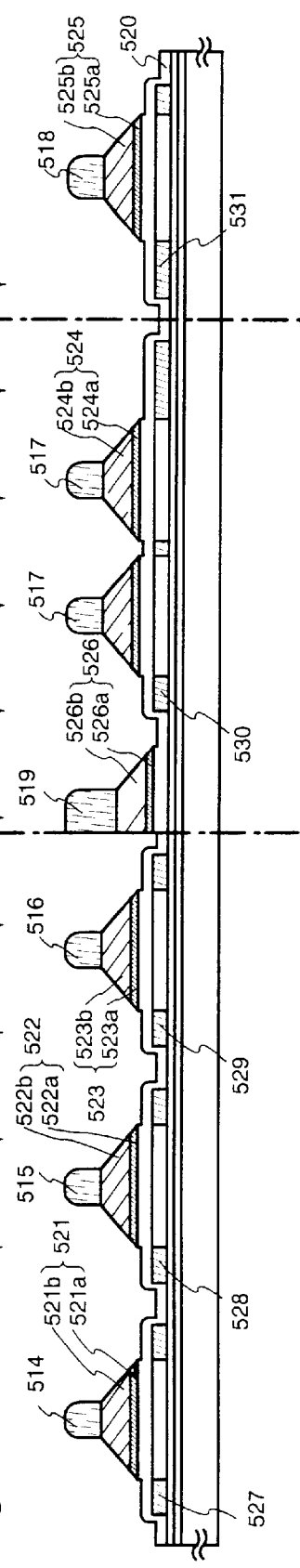

Then, a first doping process is performed without removing the masks consisting of resist, and an impurity element imparting an n-type is added to the semiconductor layer (FIG. 7C). Doping may be performed by ion doping or ion implanting. The condition of the ion doping method is such that a dosage is $1 \times 10^{13}$ to $5 \times 10^{15}$ atoms/cm², and an acceleration voltage is 60 to 100 keV. As the impurity element imparting the n-type, an element belonging to the Group 15, typically phosphorus (P) or arsenic (As) may be used. In this case, the conductive layers 521 to 525 become masks to the impurity element imparting the n-type, and first impurity regions 527 to 531 are formed in a self aligning manner. The impurity element imparting the n-type in the concentration range of $1 \times 10^{20}$ to $1 \times 10^{21}$ atoms/cm³ is added to the first impurity regions 527 to 531. Next, as shown in FIG. 8A, a second etching process is performed without removing the masks consisting of resist. In the second etching process, $CF_4$, $Cl_2$, and $O_2$ are used as the etching gases, a gas flowing rate of each gas is set as 25/25/10 (sccm), and an RF (13.56 MHz) power of 500 W is applied to a coil type electrode under a pressure of 1 Pa to generate plasma. Thus, the etching is performed about 20 seconds. An RF (13.56 MHz) power of 20 W is also applied to the side of the substrate (sample stage) and a low self bias voltage as compared with the first etching process is applied thereto. In accordance with the third etching condition, the W film is etched. Thus, in accordance with the third etching condition, the W film is anisotropically etched to form second shape conductive layers 533 to 538.

An etching reaction to the W film or the TaN film by the mixture gas of $CF_4$ and $Cl_2$ can be guessed from a vapor pressure between a generated radical or an ion species and a reaction product. When the vapor pressures of fluoride and chloride of W and TaN are compared with each other, $WF_6$ which is a fluoride of W is extremely high, and other $WCl_5$, $TaF_5$, and $TaCl_5$ have almost equal vapor pressures. Thus, in the mixture gas of $CF_4$ and $Cl_2$, both W and TaN films are etched. However, when a suitable amount of $O_2$ is added to this mixture gas, $CF_4$ and $O_2$ react with each other to form CO and F, and F radical or F ion generates in a large amount. As a result, an etching rate of the W film having the high vapor pressure of fluoride is increased. On the other hand, with respect to TaN, even if F is increased, an increase of the etching rate is relatively small. Besides, since TaN is easily oxidized as compared with W, the surface of TaN is oxidized a little by an addition of $O_2$. Since the oxide of TaN does not react with fluorine or chlorine, the etching rate of the TaN film is further decreased. Accordingly, it becomes possible to make a difference between the etching rates of the W film and the TaN film, with the result that it becomes possible to make the etching rate of the W film higher than that of the TaN film.

Subsequently, as shown in FIG. 8A, a second doping process is performed without removing the masks consisting of resist. In this case, a dosage is made lower than that of the first doping process, and an impurity element imparting the n-type is doped under the condition of a higher acceleration voltage. For example, an acceleration voltage is set as 70 to 120 keV, 90 keV in this embodiment, and the process is carried out at a dosage of $3.5 \times 10^{12}$ atoms/cm$^2$. As a result, new impurity regions are formed on the semiconductor layer inside the first impurity regions formed in FIG. 7C. The doping is performed in such a manner that the second shape conductive layers 533 to 537 are used as the masks to the impurity element, and the impurity element is added so that the impurity element is also added to the semiconductor layer under the second conductive layers 533a to 537a.

In this way, second impurity regions 539 to 543 overlapping with the second conductive layers 533a to 537a and first impurity regions 550 to 554 are formed. The impurity element imparting the n-type is made to have a concentration of from $1 \times 10^{17}$ to $1 \times 10^{19}$ atoms/cm$^3$ in the second impurity regions.

Subsequently, as shown in FIG. 8B, etching of the gate insulating film is performed without removing the masks consisting of resist. During the etching of the gate insulating film, the second conductive layers 533a to 538a are simultaneously etched, with the result that third shape conducive layers 544 to 549 are formed. With this, the second impurity regions can be distinguished between regions overlapping with the second conductive layers 544a to 548a and regions not overlapping therewith.

Then, after removing the masks consisting of resist, new masks 555 to 557 consisting of resist are formed, and a third doping process is performed as shown in FIG. 8C. With this third doping process, fourth impurity regions 558 to 563 to which an impurity element imparting a conductivity opposite to the one conductivity type is added, are formed in the semiconductor layer that becomes an active layer of p-channel TFT. The third shape conductive layers 545 and 548 are used as the masks with respect to the impurity element, and an impurity element imparting a p-type is added to form the fourth impurity regions in a self aligning manner. In this embodiment, the impurity regions 558 to 563 are formed by ion doping using diborane ($B_2H_6$). At the time of performing the third doping process, the semi-conductive layer forming the n-channel TFT is covered with masks 555 to 557 consisting of resist. With the first and the second doping processes, the impurity regions 558 to 563 are doped with phosphorus in different concentrations, respectively. However, doping is performed so that the concentration of the impurity imparting the p-channel in any of the regions falls within the range of $2 \times 10^{20}$ to $2 \times 10^{21}$ atoms/cm$^3$, with the result that the regions function as source and drain regions of the p-channel TFT, which causes no problem.

By the steps up to this, the impurity regions are formed in the respective semiconductor layers. The third shape conductive layers 544 to 548 overlapping with the semiconductor layers function as gate electrodes. Besides, the layer 549 functions as a source wiring, and the layer 548 functions as a second electrode for forming a storage capacitor.

Subsequently, the masks 555 to 557 consisting of resist are removed, and a first interlayer insulating film 564 covering the whole surface is formed. This first interlayer insulating film 564 is formed from an insulating film containing silicon by a plasma CVD method or a sputtering method into a thickness of from 100 to 200 nm. In this embodiment, a silicon oxynitride film with a film thickness of 150 nm is formed by the plasma CVD method. Of course, the first interlayer insulating film 564 is not particularly limited to the silicon oxynitride film, but an insulating film containing another silicon may be formed into a single layer or a lamination structure.

Figure 9A:
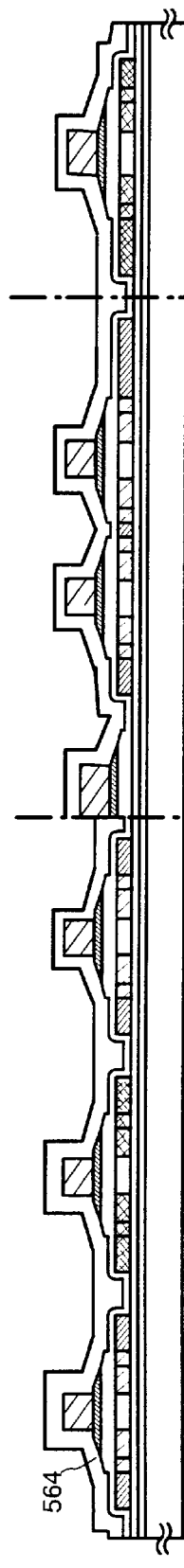
FIG. 9A and 9B are sectional views of the TFT of the embodiment 1.

Then, as shown in FIG. 9A, a step of activating the impurity elements added to the respective semiconductor layers. This activation step is carried out by a thermal annealing method using a furnace annealing oven. The thermal annealing may be performed in a nitrogen atmosphere having an oxygen content of 1 ppm or less, preferably 0.1 ppm or less and at 400 to 700° C., typically 500 to 550° C. Note that, other than the thermal annealing method, a laser annealing method, or a rapid thermal annealing method (RTA method) can be applied thereto.

Further, an activation process may be performed before forming the first interlayer insulating film 564. However, in the case where a wiring material used for the layers 544 to 548 is weak to heat, it is preferable that the activation process is performed after an interlayer insulating film (containing silicon as its main ingredient, for example, silicon nitride film) is formed to protect the wiring or the like as in this embodiment.

In addition, heat treatment at 300 to 550° C. for 1 to 12 hours is performed in an atmosphere containing hydrogen of 3 to 100% to perform a step of hydrogenating the semiconductor layers. This step is a step of terminating dangling bonds in the semiconductor layer by thermally excited hydrogen. As another means for hydrogenation, plasma hydrogenation (using hydrogen excited by plasma) may be carried out.

Besides, in the case of using the laser annealing method as the activation process, it is preferred to irradiate laser light such as an excimer laser or a YAG laser after the hydrogenating process.

Next, a second interlayer insulating film 565 made of an organic insulating material is formed on the first interlayer insulating film 564. Then, patterning is performed for forming a contact hole reaching the source wiring 549 and the contact holes reaching the respective impurity regions 550, 552, 553, 558, and 561.

Then, in a driver circuit 706, wirings 566 to 571 electrically connecting to the first impurity region or the fourth impurity region, respectively, are formed. Note that these wirings are formed by patterning a lamination film of a Ti film having a film thickness of 50 nm and an alloy film (alloy film of Al and Ti) having a film thickness of 500 nm.

Figure 9B:
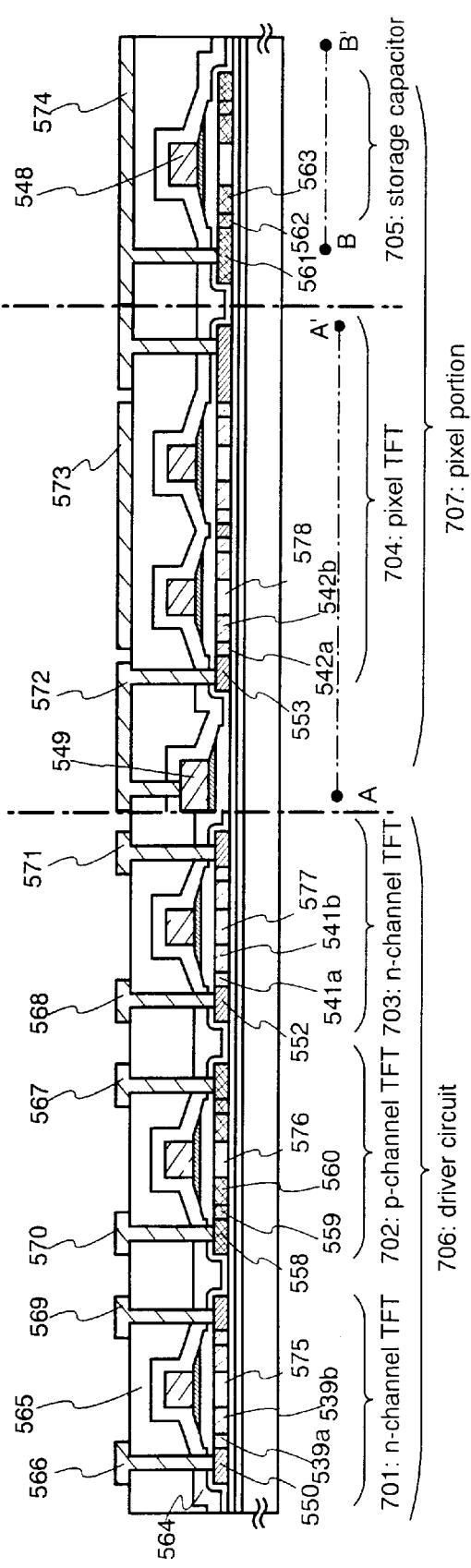

In a pixel portion 707, a pixel electrode 574, a gate conductive film 573, and a connection electrode 572 are formed (FIG. 9B). By this connection electrode 572, the source wiring 549 is electrically connected to a pixel TFT 704. Also, the gate conductive film 573 is electrically connected to the first electrode (third shape conductive layer 547). Besides, the pixel electrode 574 is electrically connected to the drain region of the pixel TFT, and further connected to the semiconductor layer which functions as one of electrodes forming a storage capacitor. Further, as the pixel electrode 574, a film containing Al or Ag as the main component, a lamination film thereof or the like is preferably used, which has excellent reflection property.

In the manner as described above, the driving circuit 706 including an n-channel TFT 701, a p-channel TFT 702, and an n-channel TFT 703, and the pixel portion 707 including the pixel TFT 704 and a storage capacitor 705 can be formed on the same substrate. In the present specification, such a substrate is called an active matrix substrate for convenience.

The n-channel TFT 701 of the driving circuit 706 includes a channel forming region 575, the third impurity region 539*b* (GOLD region) overlapping with the third shape conductive layer 544 forming the gate electrode, the second impurity region 539*a* (LDD region) formed outside the gate electrode, and the first impurity region 550 functioning as a source region or a drain region. The p-channel TFT 702 includes a channel forming region 576, a fourth impurity region 560 overlapping with the third shape conductive layer 545 forming the gate electrode, a fourth impurity region 559 formed outside the gate electrode, and the fourth impurity region 558 functioning as a source region or a drain region. The n-channel TFT 703 includes a channel forming region 577, the third impurity region 541*b* (GOLD region) overlapping with the third shape conductive layer 546 forming the gate electrode, a second impurity region 541*a* (LDD region) formed outside the gate electrode, and the first impurity region 552 functioning as a source region or a drain region. The pixel TFT 704 of the pixel portion includes a channel forming region 578, the third impurity region 542*b* (GOLD region) overlapping with the third shape conductive layer 547 forming the gate electrode, a second impurity region 542*a* (LDD region) formed outside the gate electrode, and the first impurity region 553 functioning as a source region or a drain region. Besides, an impurity element imparting p-type is added to the respective semiconductor layers 561 to 563 functioning as one of electrodes of the storage capacitor 705 at the same concentration with the fourth impurity region. The storage capacitor 705 is formed mainly from the second electrode 548 and the semiconductor layers 561 to 563 using the insulating film (the same film with the gate insulating film) as a dielectric member.

Figure 10:
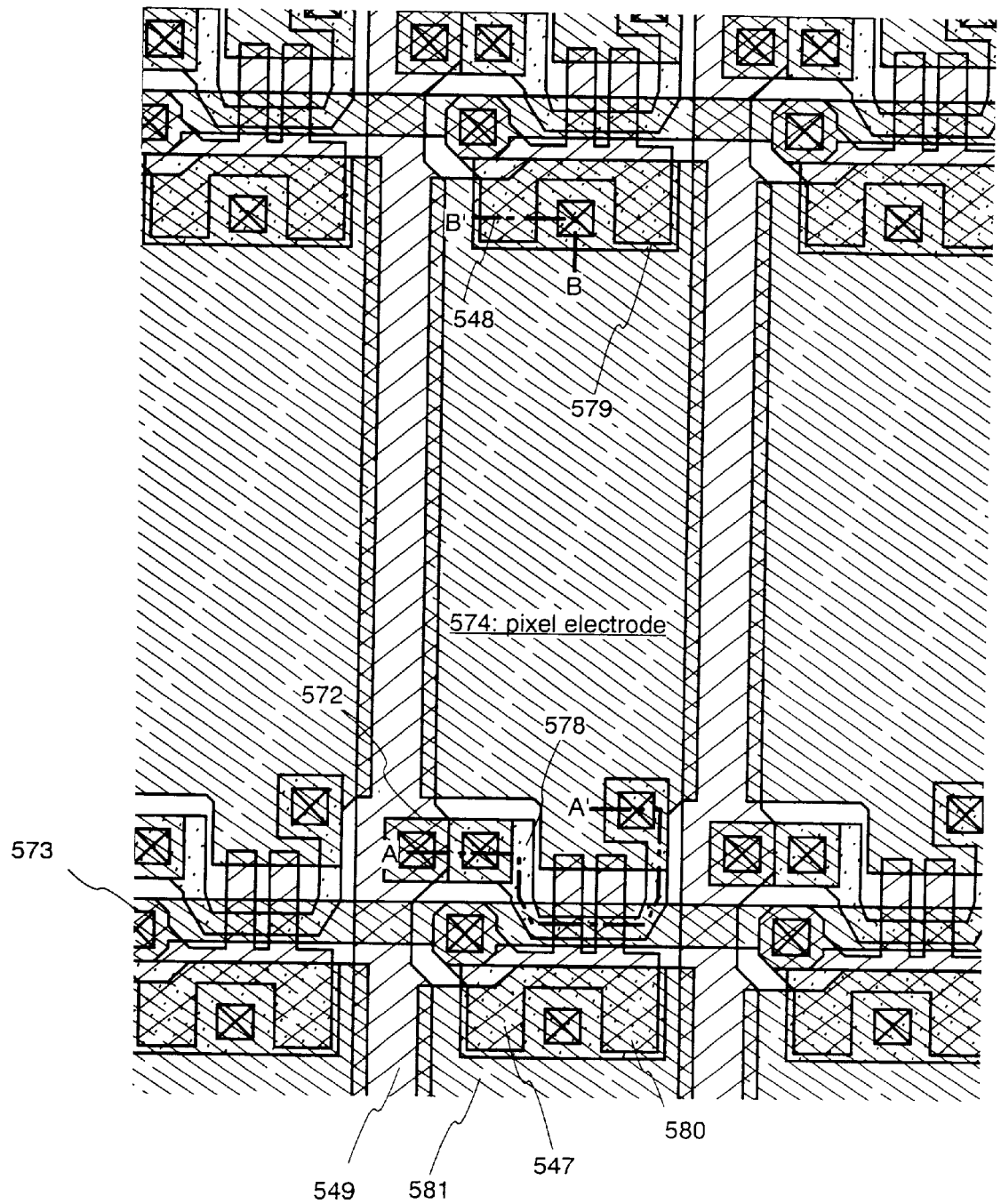
FIG. 10 is a top view of a pixel portion of an active matrix substrate fabricated in the embodiment 1.

A top view of the pixel portion of the active matrix substrate manufactured in this embodiment is shown in FIG. 10. Note that the same reference numerals are used to indicate parts corresponding FIGS. 5A to 5C and FIGS. 7A to 10. A dash line A–A' in FIG. 10 corresponds to a sectional view taken along the line A–A' in FIGS. 9B. Also, a dash line B–B' in FIG. 10 corresponds to a sectional view taken along the line B–B' in FIG. 9B.

Like this, the active matrix substrate having a pixel structure according to the present embodiment has a feature such that the first electrode 547 a part of which functions as the gate electrode and a gate wiring 573 are formed on the different layers so that the light shielding of the semiconductor layers are performed by the gate wiring 573.

Further, in the pixel structure of the present embodiment, an end portion of the pixel electrode is formed by arranging it so as to overlap with the source wiring so that the gap between the pixel electrodes is shielded from light without using a black matrix.

Besides, it is preferred that the surface of the pixel electrode in accordance with this embodiment is made uneven by a known method such as a sand plaster method or an etching method, and a whitening degree is increased by scattering the reflection light, while preventing a mirror-reflection.

By taking the above-mentioned pixel structure, a pixel electrode having a larger area may be arranged, thereby capable of improving an aperture ratio.

In addition, in accordance with the process steps of this embodiment, the number of photo masks needed for the manufacture of the active matrix substrate may be made into five pieces (a patterning mask of semiconductor layers 578, and 579, and a patterning mask of a first wiring (including the first electrode 547, the second electrode 548, and the source wiring 549)), a patterning mask for forming a source region and a drain region of a p-type TFT, and a patterning mask of a second wiring (including the pixel electrodes 574, and 581, the connection electrode 572, and the gate wiring 573). As a result, it can contribute to shorten the manufacturing steps, to lower the manufacturing cost, and to improve the yields.

Figure 17:
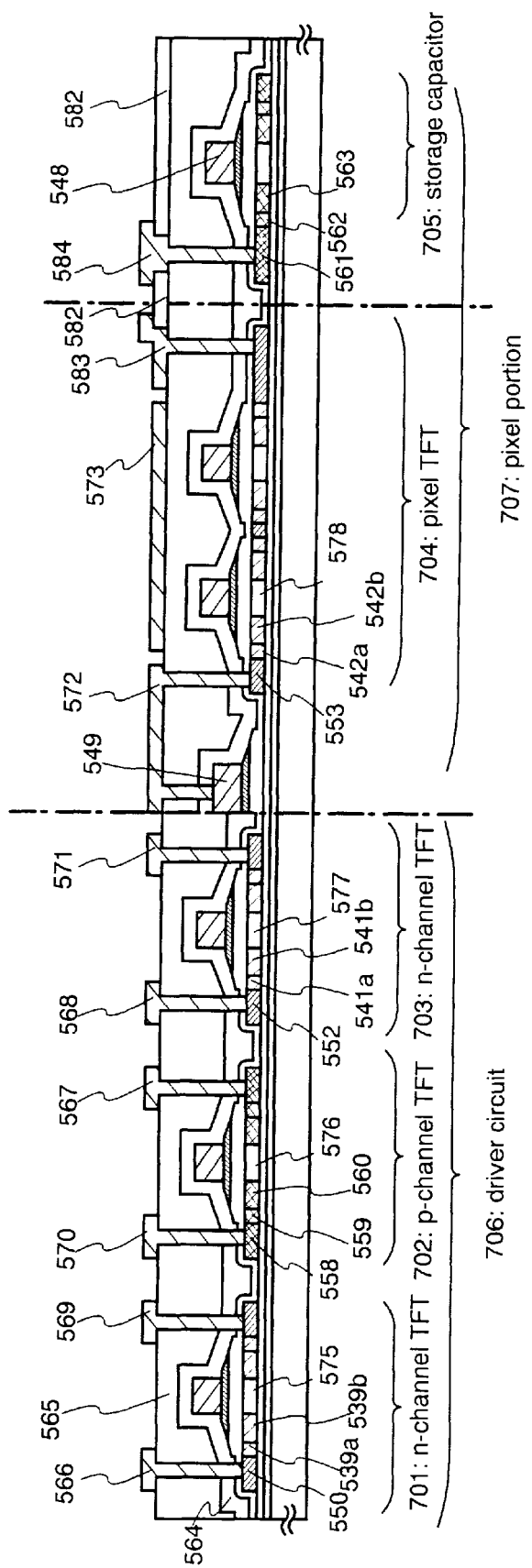
FIG. 17 is a sectional view of a TFT of embodiment 1.

FIG. 17 shows a cross section of an active matrix substrate that is suitable for a transmission type liquid crystal display device. The manufacturing process until the formation of the second interlayer film is the same as that of the reflection type described above. A transparent conductive film is formed on the second interlayer film. Then, a patterning is performed for the formation of a transparent conductive film layer 582. As the material of the transparent conductive film, a compound of indium oxide and tin oxide or a compound of indium oxide and zinc oxide may be used.

Then, in a driver circuit 706, wirings 566 to 571 each electrically connected to the first impurity region or the fourth impurity region are formed. Note that those wirings are formed by patterning the lamination film of Ti film having a film thickness of 50 nm and an alloy film (alloy film of Al and Ti) having a film thickness of 500 nm. Besides, in a pixel portion 707, pixel electrodes 583 and 584, a gate electrode 573, and a connection electrode 572 are formed. Like this, the active matrix substrate that is suitable for the transmission type liquid crystal display device can be formed by increasing the number of masks by one.

[Embodiment 2]

In this embodiment, descriptions will be made of another embodiment. The contents are similar to that in Embodiment 1, and therefore references may be made to the drawings shown in Embodiment 1.

Until the formation of the protective film, the same manufacturing process may be performed similarly as in Embodiment 1. After the formation of the protective film, dehydrogenation of the amorphous silicon film (500° C. for 1 hour) and the subsequent thermal crystallization (550° C. for 4 hours) are performed. In this case, the thermal crystallization may be performed by a known method without adding a catalyst element such as Ni.

To control the threshold voltage (Vth) of the n-channel TFT, an impurity element imparting the p-type is then added thereto. As an impurity element that imparts the p-type to the semiconductor layer, boron (B), aluminum (Al), gallium (Ga), etc., belonging to the Group 13 of periodic table are known. In this embodiment, boron (B) is added thereto.

Then, the protective film is removed. The subsequent process steps after the continuous processing of washing of the semiconductor surface and laser annealing are performed similarly as in Embodiment 1.

[Embodiment 3]

Another embodiment of the present invention will be described with reference to FIGS. 6A to 6C. This embodiment is an example characterized in that a continuous processing from the formation of the base film until the laser crystallization is performed.

As a substrate 600, a glass substrate, a quartz substrate, a ceramic substrate or the like may be used. A silicon substrate, a metallic substrate or a stainless substrate having an insulating film formed on the surface of the substrate may also be used. In addition, a plastic substrate having heat resistance to a process temperature of this embodiment may be used.

Figure 6A:
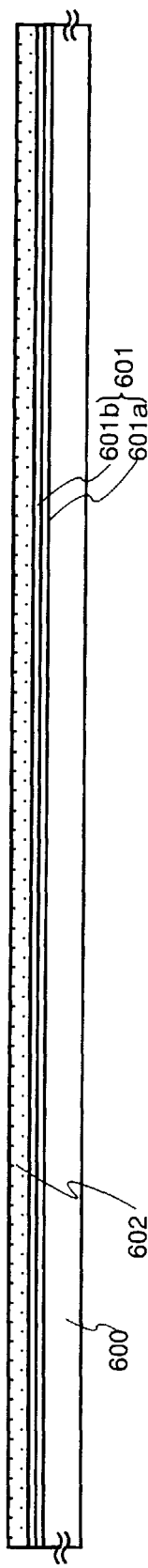
FIGS. 6A to 6C are sectional views of a TFT of embodiment 2.

Then, as shown in FIG. 6A, a base film 601 consisting of an insulating film such as a silicon oxide film, a silicon nitride film or a silicon oxynitride film is formed on the substrate 600. In this embodiment, two-layer structure is used for the base film 601. However, a single layer or a lamination structure consisting of two or more layers of the insulating film described above may be used. The first layer and the second layer of the base film 601 are continuously formed in a first film formation chamber by a plasma CVD method. As the first layer of the base film 601, a silicon oxynitride film 601a is formed into a thickness of from 50 to 100 nm using as reaction gases $SiH_4$, $NH_3$, and $N_2O$. Then, as the second layer of the base film 601, a silicon oxynitride film 601b which is formed by using as reaction gases $SiH_4$ and $N_2O$, is formed into a lamination with a thickness of from 100 to 150 nm.

Then, an amorphous semiconductor film 602 is formed on the base film 601 in a second film formation chamber. The amorphous semiconductor film is formed into a thickness of from 30 to 60 nm. The material of the amorphous semiconductor film is not particularly limited, but is preferably formed from silicon, a silicon germanium (SiGe) alloy, or the like. In this embodiment, the amorphous silicon film is formed using $SiH_4$ gas by a plasma CVD method.

Further, the base film and the amorphous semiconductor film can be formed by the same film formation method, and therefore the base film 601 and the amorphous semiconductor film 602 can be formed continuously.

Subsequently, a first laser annealing is performed by using a laser apparatus. It is recognized that it is difficult to crystallize by laser annealing the amorphous semiconductor film which has been subjected to doping. Therefore, the laser annealing is performed for the purpose of advancing the crystallization to some extent. The conditions of the laser annealing may be appropriately determined by an operator.

Then, a silicon oxide film 604 as a protective film is formed in a third film formation chamber. For example, in the case where a plasma CVD method is used, TEOS (tetraethyl orthosilicate) and $O_2$ are mixed to form the protective film having a thickness of from 100 nm to 150 nm.

Figure 6B:
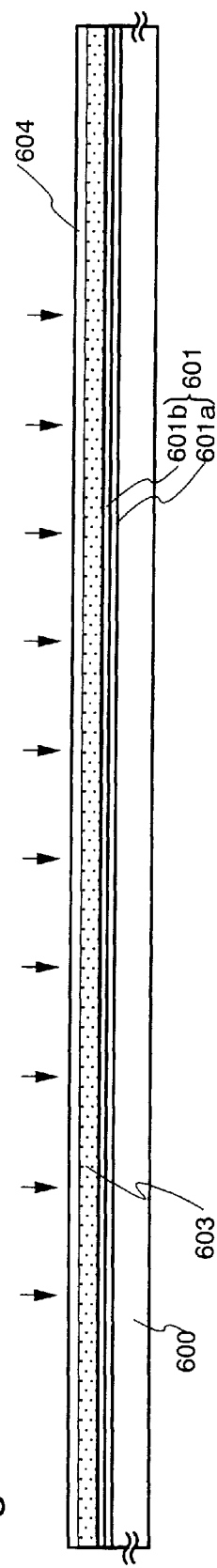
Figure 6C:
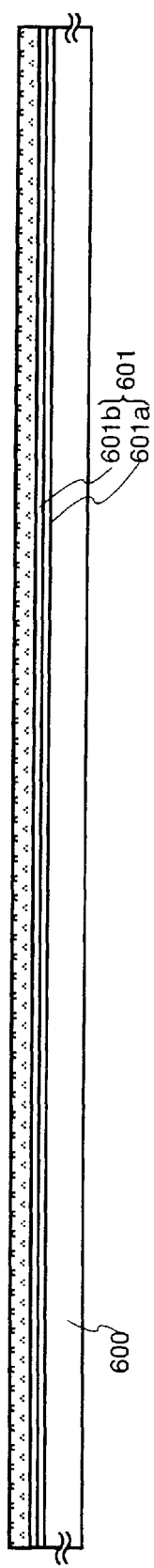

Then, to control the threshold voltage (Vth) of the n-channel type TFT, an impurity element imparting a p-type is added thereto by a doping apparatus (FIG. 6B). As an impurity element that imparts the p-type to the semiconductor layer, boron (B), aluminum (Al), gallium (Ga), etc., belonging to the Group 13 of periodic table are known. In this embodiment, boron (B) is added thereto.

After performing the addition of boron, crystallization of the semiconductor film 603 is performed by a laser apparatus without removing the silicon oxide film 604 as the protective film. The conditions of this crystallization may appropriately be determined by an operator. After the crystallization, the silicon oxide film 604 as the protective film is removed (FIG. 6C).

Thereafter, the same process procedures may be taken as in Embodiment 1 from the formation of an island-like semiconductor layer.

[Embodiment 4]

In this embodiment, by referring to drawings, description will be made of a method of simultaneously forming on the same substrate a pixel portion and TFTs (n-channel TFT and p-channel TFT) for forming a driver circuit in the periphery of the pixel portion.

Figure 18A:
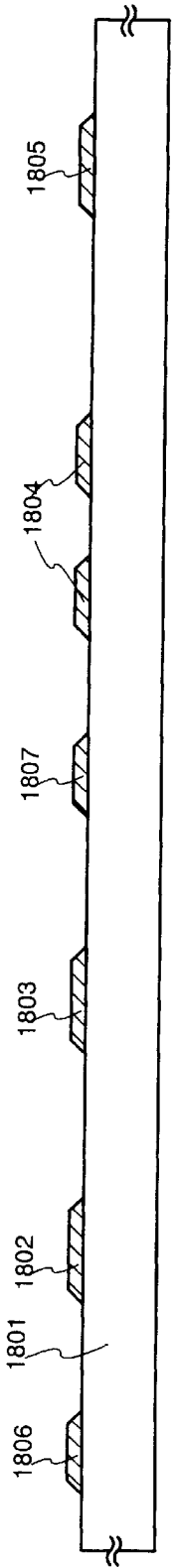
FIGS. 18A to 18D are sectional views of a TFT of embodiment 4.

First, as shown in FIG. 18A, on a substrate 1801 consisting of glass such as barium borosilicate glass or aluminum borosilicate, represented by such as Corning #7059 glass and #1737 glass, gate electrodes 1802 to 1804, source wirings 1806 and 1807, and a capacitor wiring 1805 for forming a storage capacitor of the pixel portion are formed from a conductive film containing one or plural kinds of components preferably selected from molybdenum (Mo), tungsten (W), and tantalum (Ta). For example, from the view points of lowering the resistivity and the heat resistance, an alloy of Mo and W is suitable. Besides, the surface is subjected to oxidizing treatment to form a gate electrode using aluminum.

The gate electrode formed by using the first photo mask is formed into a thickness of from 200 to 400 nm, preferably 250 nm, and to enhance the coating property (step coverage) of a coating film formed on the upper layer of the gate electrode, an end portion of the coating film is formed into a taper shape. The tapered portion is formed so that an angle of the tapered portion becomes 5 to 30°, preferably 15 to 25°. The tapered portion is formed by a dry etching method, and the angle of the tapered portion is adjusted by an etching gas and a bias voltage applied to a substrate side.

Figure 18B:
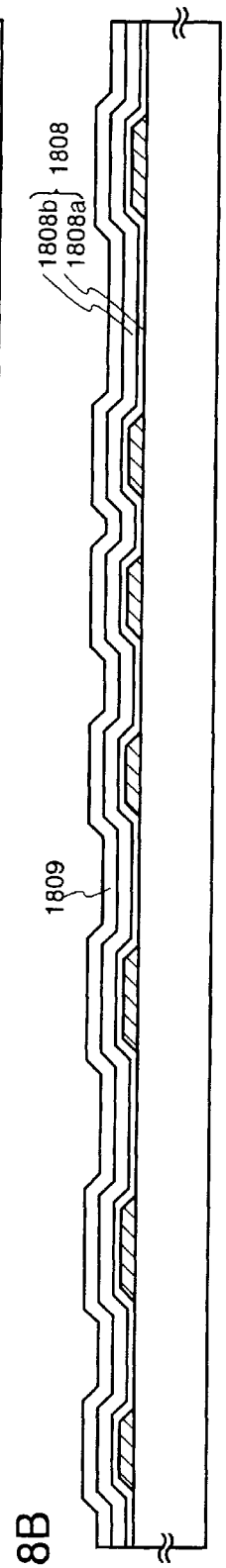

Subsequently, as shown in FIG. 18B, gate electrodes 1802 to 1804, source wirings 1806 and 1807, a first insulating layer 1808 covering a capacitor wiring 1805 for forming a storage capacitor of the pixel portion. The first insulating layer 1808 is formed by a plasma CVD method or a sputtering method into a thickness of from 40 to 200 nm using an insulating film containing silicon. For example, the first insulating layer 1808 is formed from a silicon nitride film 1808a having a film thickness of 50 nm and a silicon oxide film 1808b having a film thickness of 120 nm. Other than the above, a silicon oxynitride film ($SiO_xN_y$) formed from $SiH_4$, $N_2O$, and $NH_3$ by the plasma CVD method may be used.

The first insulating layer 1808 is used as the gate insulating film by forming a semiconductor layer on the upper layer. However, the first insulating layer 1808 also functions as a blocking layer for preventing an impurity such as alkali metal from diffusing from the substrate 1801 to the semiconductor layer.

A crystalline semiconductor film 1809 is formed into a thickness of from 30 to 100 nm, preferably 40 to 60 nm on the first insulating layer 1808. The material of the crystalline semiconductor film is not particularly limited, but may be formed typically from silicon or an alloy of silicon germanium ($Si_xGe_{1-x}$; x=0.01 to 2 atomic %). The crystalline semiconductor film may be formed by any one of the methods described in Embodiments 1, 2 and 3.

Figure 18C:
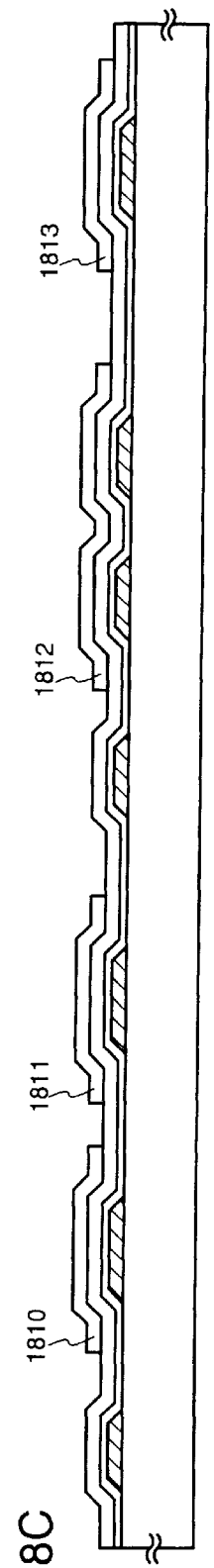

A semiconductor layer 1809 formed from a polycrystalline semiconductor is formed into a predetermined pattern using a second photo mask. FIG. 18C shows semiconductor layers 1810 to 1813 divided into an island shape. The semiconductor layers 1810 to 1812 are formed so as to partially overlap with gate electrodes 1802 and 1804.

Figure 18D:
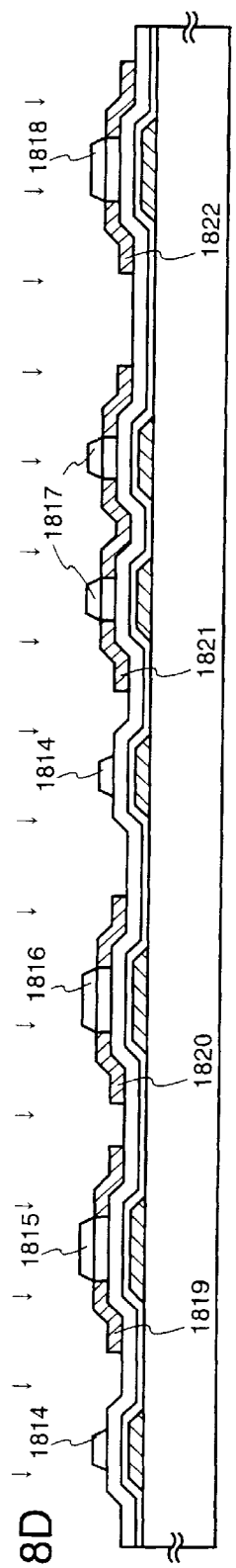

Thereafter, an insulating film made from silicon oxide or silicon nitride is formed into a thickness of from 100 to 200 nm on the divided semiconductor layers 1810 to 1813. As shown in FIG. 18D, a third insulating layers 1814 to 1818 as channel protecting films are formed on the semiconductor layers 1810 to 1813 in a self aligning manner by an exposure process from the back surface using as masks the gate electrodes.

Then, a first doping step for forming LDD regions of n-channel TFT is performed. An ion doping method or an ion implanting method may be used as the doping method. Phosphorus(P) is added as an n-type impurity (donor), and the first impurity regions 1819 to 1822, which are formed using as masks the third insulating layers 1814 to 1818, are formed. The concentrations of the donors in these regions are set between $1 \times 10^{16}$ to $2 \times 10^{17}/\text{cm}^3$.

A second doping step is a step of forming a source region and a drain region of the n-channel TFT, and as shown in FIG. 19A, masks 1823 to 1825 consisting of resist are formed using a third photo mask. The masks 1824 and 1825 are formed so as to cover the LDD regions of the n-channel TFT, and a donor impurity is added to second impurity regions 1826 to 1828 within a concentration range of from $1 \times 10^{20}$ to $1 \times 10^{21}/\text{cm}^3$.

It is preferred that, almost simultaneously with the second doping step, etching treatment is performed by fluoric acid under a state that the masks 1823 to 1825 are formed, to thereby remove the third insulating layers 1814 and 1818.

The formation of a source region and a drain region of the p-channel TFT is performed by a third doping step, as shown in FIG. 19B, and a p-type impurity (acceptor) is added by an ion doping method or an ion implanting method to form third impurity regions 1830 and 1831. At this time, a mask 1829 is formed so as to cover n-channel TFTs. The concentrations of the p-type impurity in these regions is adjusted so as to fall within a range of from $2 \times 10^{20}$ to $2 \times 10^{21}/\text{cm}^3$.

Subsequently, as shown in FIG. 19C, a second insulating layer is formed on the semiconductor layer. The second insulating layer is preferably formed from a plurality of insulating films. A first layer 1832 of the second insulating layers formed on the semiconductor layer is made from an inorganic insulator consisting of a silicon nitride film or a silicon oxynitride film containing hydrogen into a thickness of from 50 to 200 nm. Thereafter an activation step for activating the impurities added to the respective semiconductor layers is performed. This step is performed by a thermal annealing method using an annealing furnace. Other than the above, a laser annealing method or a rapid thermal annealing method (RTA method) may be used. In the thermal annealing method, heat treatment is performed under a nitrogen atmosphere within a temperature range of from 400 to 600° C., typically 450 to 500° C. for 1 to 4 hours.

With this heat treatment, the activation of the impurity element is performed, and at the same time, hydrogen within a silicon nitride film or a silicon oxynitride film of the first layer 1832 of the second insulating layers is radiated, thereby being capable of hydrogenation of the semiconductor layer. This step is a step of terminating by hydrogen a dangling bond of the semiconductor layer. As means for efficiently performing hydrogenation, plasma hydrogenation (using hydrogen excited by plasma) may be performed before forming the first layer 1832 of the second insulating layer.

Figure 20A:
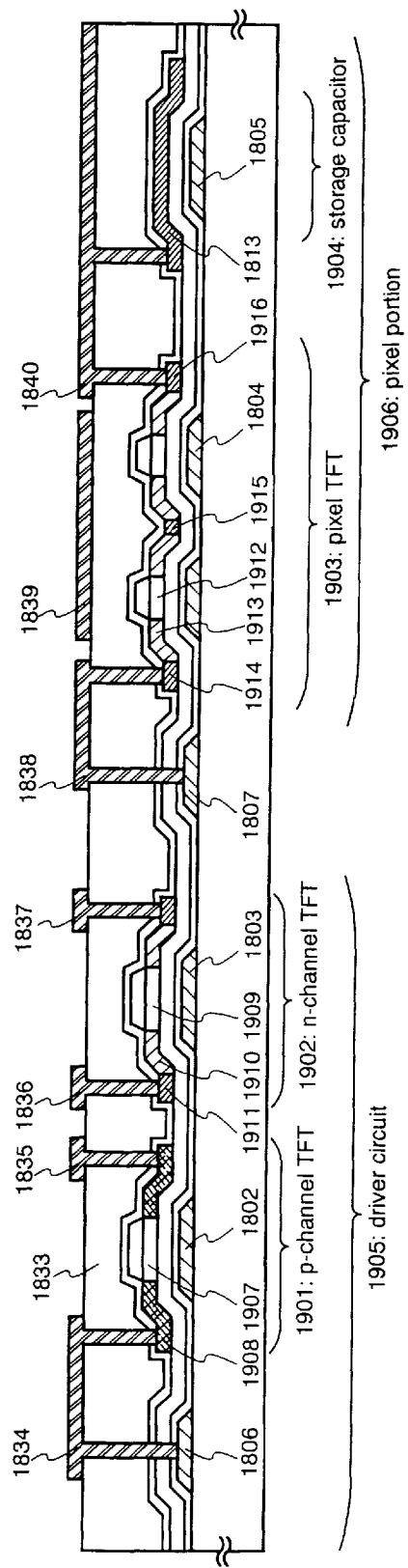
FIGS. 20A to 20C are sectional views of the TFT of the embodiment 4.

A second layer 1833 of the second insulating layers shown in FIG. 20A is formed from an organic insulating material such as polyimide or acrylic to level the surface thereof. Of course, a silicon oxide film formed by a plasma CVD method using TEOS (tetraethyl orthosilicate) may be used. However, from the view point of enhancing the flatness thereof, it is preferred to use the organic material described above.

Subsequently, contact holes are formed using a fifth photo mask. A connection electrode 1834 and source or drain wirings 1835 to 1837 are then formed in a driver circuit 1905 using a sixth photo mask and using aluminum (Al), titan (Ti), tantalum (Ta) or the like. Besides, in a pixel portion 1906, a pixel electrode 1840, a gate wiring 1839, and a connection electrode 1838 are formed.

Thus, the driver circuit having a p-channel TFT 1901 and an n-channel TFT 1902 and the pixel portion 1906 having a pixel TFT 1903 and a storage capacitor 1904 are formed on the same substrate. In the p-channel TFT 1901 of the driver circuit 1905, a channel forming region 1907 and a source or a drain region 1908 made from the third impurity region are formed. In an n-channel TFT 1902, there are formed a channel forming region 1909, an LDD region 1910 made from the first impurity region, and a source or a drain region 1911 formed from the second impurity region. The pixel TFT 1903 of the pixel portion 1906 has a multi-gate structure, and a channel forming region 1912, an LDD region 1913, and source or drain regions 1914 and 1916 are formed therein. The second impurity region located between LDD regions is effective for lowering an off-current. The storage capacitor 1904 is constructed of the capacitor wiring 1805, the semiconductor layer 1813, and the first insulating layer formed therebetween.

In the pixel portion 1906, the source wiring 1807 is electrically connected to the source or drain region 1914 of the pixel TFT 1903 through the connection electrode 1838. Besides, the gate wiring 1839 is electrically connected to the first electrode 1804. Further, the pixel electrode 1840 is connected to the source or drain region 1916 of the pixel TFF 1903 and to the semiconductor layer 1813.

Figure 20B:
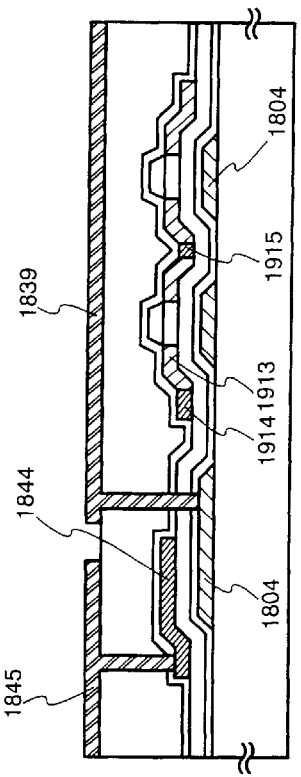
Figure 20C:
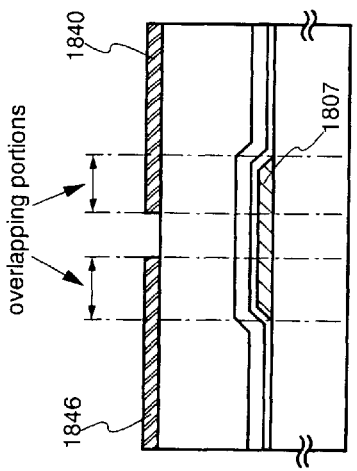

FIG. 20B is a drawing for explaining a contact portion of the gate electrode 1804 and the gate wiring 1839. The gate electrode 1804 serves also as one of the electrodes of the storage capacitor of the adjacent pixel, and a capacitor is formed by an overlapping portion between the gate electrode 1804 and the semiconductor layer connected to the pixel electrode 1845. Besides, FIG. 20C shows a positional relationship between the source wiring 1807 and the pixel electrode 1840 and the adjacent pixel electrode 1846. The end portion of the pixel electrode is formed on the source wiring 1807 to form an overlapping portion, thereby enhancing the shielding property by shielding stray light. Note that in the present specification, such a substrate is called an active matrix substrate for convenience.

One of the merits for forming a TFT into a reverse stagger type resides in that an LDD region overlapping with the gate electrode can be formed in the n-channel TFT in a self aligning manner by an exposure process from the back surface of the substrate, and in association with such a feature that the gate insulating film and the semiconductor layer can be formed continuously, the fluctuation of electrical characteristics of the TFT can be reduced.

The pixel structure shown in FIGS. 20A to 20C is suitable for a reflection type liquid crystal display device. However, similar to Embodiment 1, if the transparent conductive film is used, the pixel structure suitable for a transmission type liquid crystal display device can be formed.

[Embodiment 5]

Figure 11A:
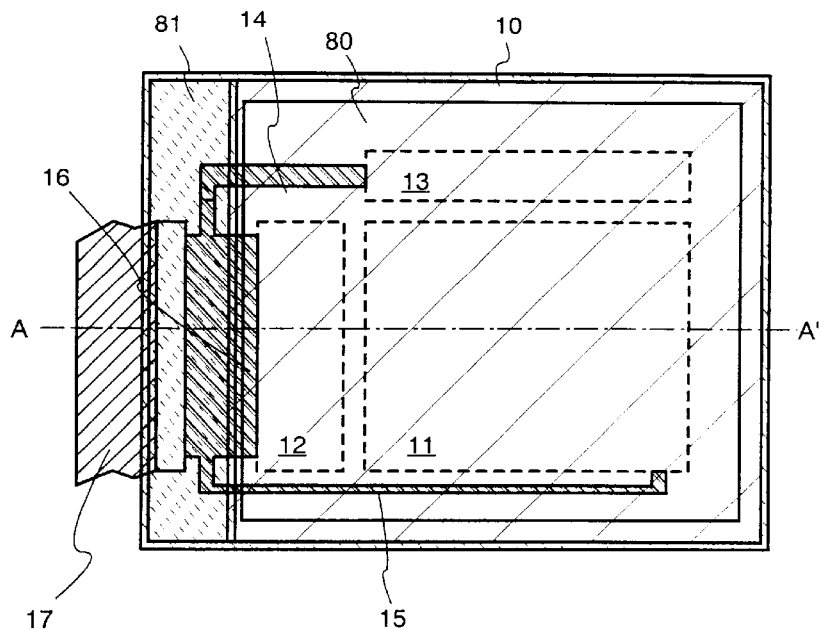
FIGS. 11A and 11B are a top view and a sectional view of an EL display panel of embodiment 5.

In this embodiment, an example will be described that EL display device is formed using active matrix substrate formed according to the above mentioned Embodiments 1 to 4. The EL (electro-luminescence) display device referred to in this specification includes triplet-based light emission devices and/or singlet-based light emission devices, for example. FIG. 11A is a top view of an EL display panel. In FIG. 11A, reference numeral 10 denotes a substrate, 11 denotes a pixel portion, 12 denotes a source side driver circuit and 13 denotes a gate-side driver circuit. Each driver circuit is connected to an FPC 17 through wirings 14 to 16 so as to be connected to external equipment.

Figure 11B:
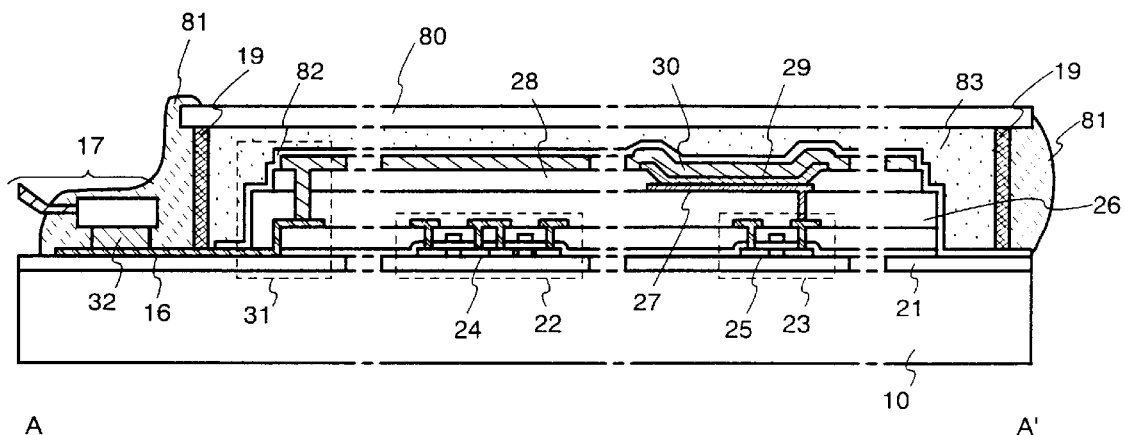

FIG. 11B shows a cross sectional structure of A–A' of FIG. 11A. The counter substrate 80 is provided at least on top of the pixel portion, preferably top of the driver circuits and the pixel portion. The counter substrate 80 is attached to the active matrix substrate, on which TFTs and a self-emitting layer using EL materials are formed with a sealant 19. The sealant 19 is mixed with a filler (not shown in the figure), two substrates are attached together with the filler at equal spaces. Further, the outside of the sealant 19 and the top surface and the periphery portion of FPC 17 has a structure of being filled up by the sealant 81. As materials of the sealant 81, silicone resin, epoxy resin, phenol resin and butyl rubber are used.

As it is, the active matrix substrate 10 and the counter substrate 80 are attached together with a sealant 19, space is generated therebetween. A filler 83 is filled with the space. The filler 83 has an effect of attachment of the counter substrate 80. The PVC (polyvinyl chloride), epoxy resin, silicone resin and EVA (ethylene vinyl acetate) can be used as the filler 83. A self-emitting layer is weak to moisture such as water and is likely to be degraded, so that it is preferable to mix a drying agent such as barium oxide in the filler 83 so as to keep an effect of moisture absorption. Further, a passivation film 82 is formed on the self-emitting layer by the silicon nitride film and silicon oxynitride film to protect from corrosion by alkali element which contains in the filler 83.

In FIG. 11B, the TFT 22 for a driver circuit (CMOS circuit which is composed of n-channel type TFT and p-channel type TFT is shown here), and the TFT 23 for a pixel portion (only TFT controlling current to an EL element is shown here) are formed on a substrate 10 and a base film 21.

To manufacture the EL display device from an active matrix substrate in a state of Embodiments 1 to 4, an interlayer insulating film (a flattening film) 26 made of resin material, is formed on the source wiring, the drain wiring and a pixel electrode 27 made of a transparent conductive film, which is connected electrically to drain of the TFT 23 for a pixel portion, is formed thereon. As a transparent conductive film, a compound of indium oxide and tin oxide (which is called as ITO), and a compound of indium oxide and zinc oxide can be used. After forming the pixel electrode 27, an insulating film 28 is formed, and an opening portion is formed on the pixel electrode 27.

Next, a self-emitting layer 29 is formed. The self-emitting layer 29 may have a lamination structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and an ink jet method can be used.

In this embodiment, the EL layer is formed by vapor deposition, ink jet method or dispenser method using a shadow mask. By forming light-emitting layers (red light-emitting layer, green-light emitting layer, and blue light-emitting layer) capable of emitting light with different wavelengths on respective pixels, a color display can be performed. In addition, a combination of a color conversion layer (CCM) and a color filter, or a combination of a white light-emitting layer and a color filter may be used. Needless to say, an EL display device emitting single color light can also be used.

When the self-emitting layer 29 is formed, a cathode 30 is formed thereon. It is desirable to remove moisture and oxygen present at an interface between the cathode and the self-emitting layer 29 as much as possible. Thus, it is required to continuously form the self-emitting layer 29 and the cathode 30 in a vacuum, or to form the self-emitting layer 29 in an inactive atmosphere, and form the cathode 30 in a vacuum without exposing the self-emitting layer 29 to the outside air. In this embodiment, a film formation device of a multi-chamber system (cluster tool system) is used to make the above mentioned film formation possible.

The cathode 30 is connected to the wiring 16 in a region denoted by reference numeral 31. The wiring 16 is a power supply line for supplying a predetermined voltage to the cathode 30, and is connected to the FPC 17 via anisotropic conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening portion before forming the self-emitting layer). Furthermore, when the insulating film 28 is etched, the interlayer insulating film 26 may also be etched together. In this case, if the interlayer insulating film 26 and the insulating film 28 are made of the same resin material, the shape of the contact holes can be made fine.

Furthermore, the wiring 16 is electrically connected to the FPC 17 through a gap between the sealant 19 and the substrate 10 (the gap is filled with a sealant 81). Herein, although description is made with respect to the wiring 16, other wirings 14 and 15 are also electrically connected to the FPC 17 through under the sealant 18.

Figures 12A, 12B:
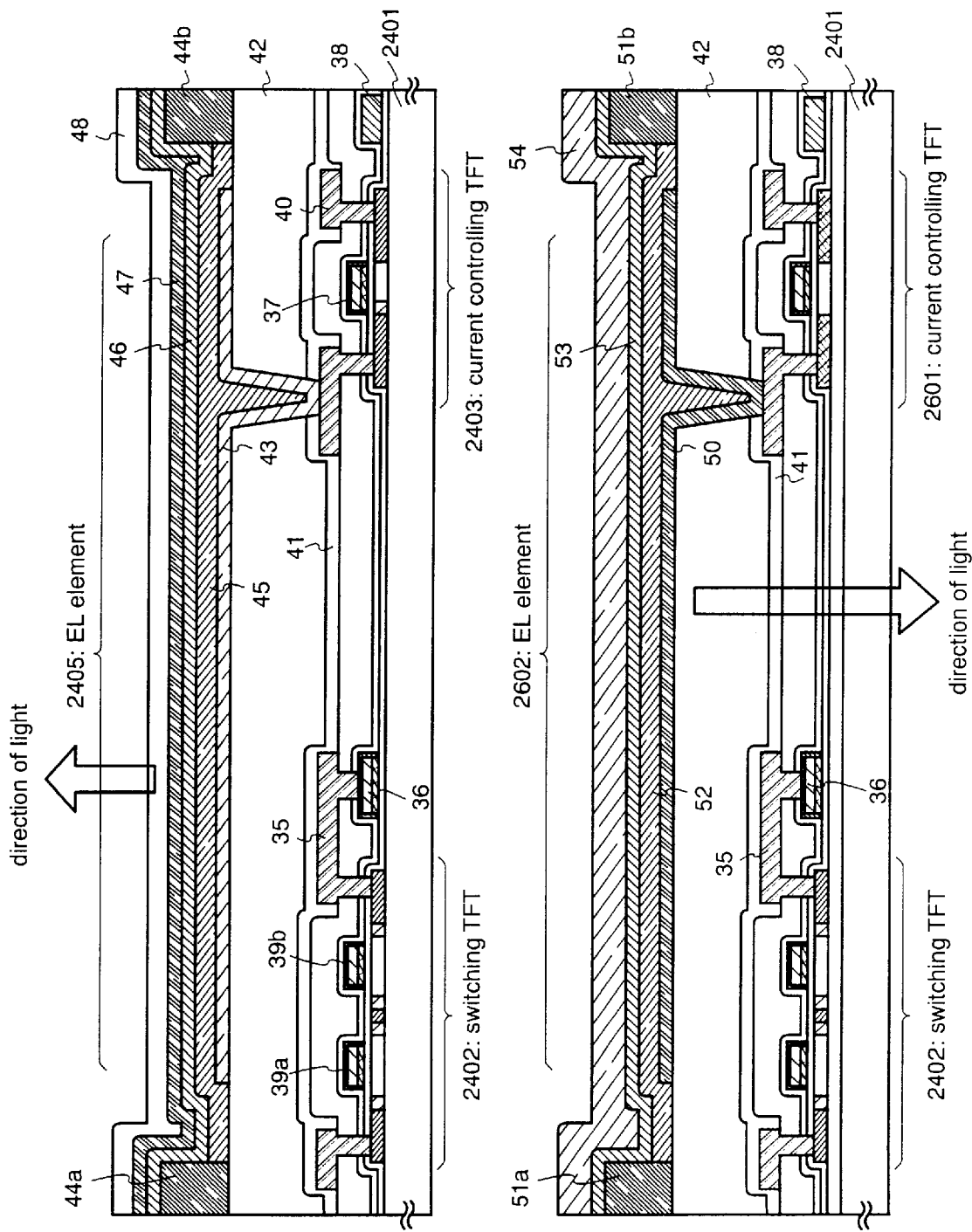
FIGS. 12A and 12B are sectional views showing EL display panels of the embodiment 5.
Figure 13:
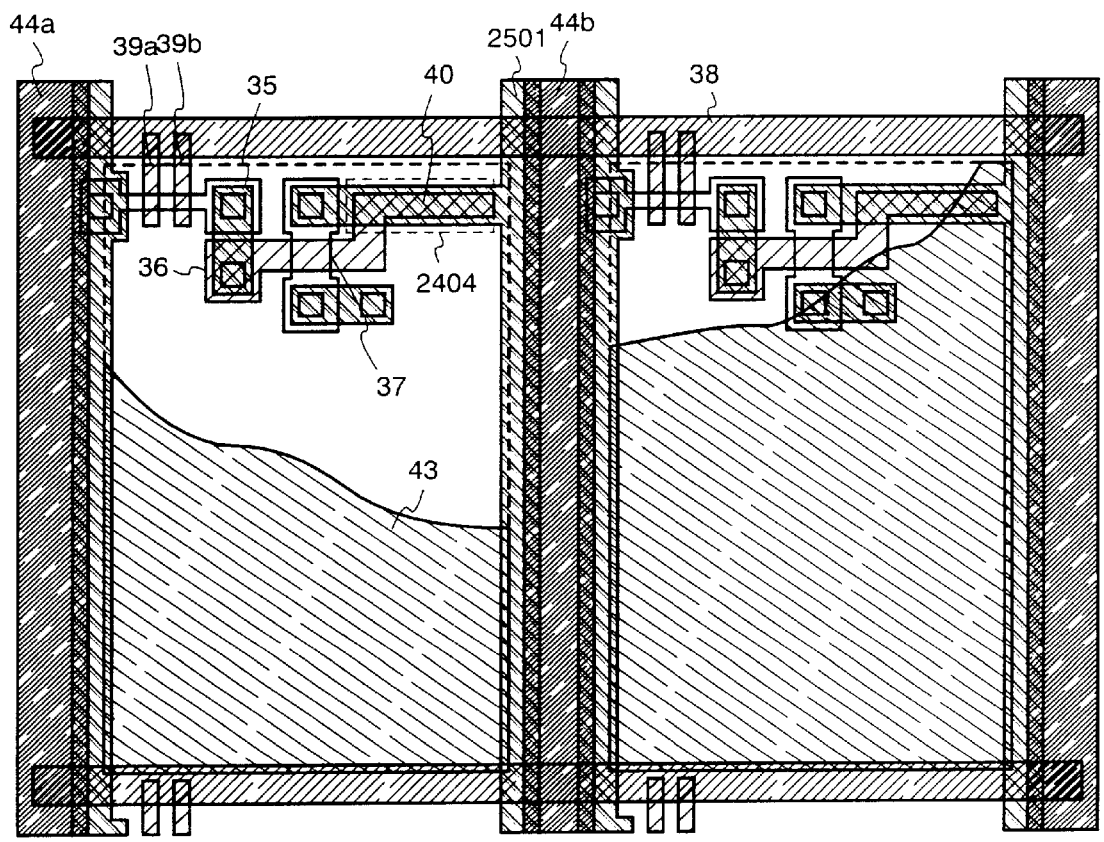
FIG. 13 is a top view showing the EL display panel of the embodiment 5.

FIG. 12 shows a more detailed cross-sectional structure of the pixel portion. FIG. 13 shows a top structure thereof. In FIG. 12A, a switching TFT 2402 provided on a substrate 2401 is formed according to the same structure of the pixel TFT 704 shown in FIG. 9B of Embodiment 1. In this embodiment, the TFT 2402 has a double-gate structure, however, it may have a triple gate structure, or a multi-gate structure having more gates. The current controlling TFT 2403 has a structure that the LDD is provided overlapping with a gate electrode only at the drain side, and that capability of the current driver is enhanced by lowering the parasitic capacitance and the serial resistance between the gate and the drain. The current controlling TFT functions as an element for controlling the amount of a current flowing through an EL element, so that the current controlling TFT 2403 is likely to be degraded by heat and hot carriers due to a large amount of current flowed therethrough. Therefore, an LDD region overlapping partly with a gate electrode, is provided on the current controlling TFT, thereby preventing the deterioration of TFT and enhancing the stability of the operation. At this time, a drain wiring 35 of the switching TFT 2402 is electrically connected to a gate electrode 37 of the current controlling TFT by a wiring 36. Furthermore, a wiring 38 is a gate wiring electrically connected to gate electrodes 39a and 39b of the switching TFT 2402.

Furthermore, in this embodiment, the current controlling TFT 2403 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 13, a wiring to be the gate electrode 37 of the current controlling TFT 2403 overlaps a drain wiring 40 of the current controlling TFT 2403 via an insulating film in a region 2404. In the region 2404, a capacitor is formed. The capacitor 2404 functions for holding a voltage applied to a gate of the current controlling TFT 2403. The drain wiring 40 is connected to a current supply line (power source line) 2501 so as to be always supplied with a constant voltage.

A first passivation film 41 is provided on the switching TFT 2402 and the current controlling TFT 2403, and a flattening film 42 that is made of a resin insulating film is formed thereon. It is very important to flatten the step difference due to TFTs by using the flattening film 42. The step difference may cause a light-emitting defect because the self-emitting layer to be formed later is very thin.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a lamination film thereof can be preferably used. Needless to say, a lamination structure with other conductive films may also be used. A light-emitting layer 44 is formed in a groove (corresponding to a pixel) formed by banks 44a and 44b made of an insulating film (preferably resin). Herein, only one pixel is shown, however, light-emitting layers corresponding to each color R (red), G (green), and B (blue) may be formed. As an organic EL material for the light-emitting layer, polyparaphenylene vinylene (PPV), polyvinyl carbazole (PVK), polyfluorene, a π-conjugate polymer material and so forth are used.

In this embodiment, a self-emitting layer with a lamination structure is used, in which a hole injection layer 46 made of PEDOT (polyethylene dioxythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward the upper of TFTs), so that the anode must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

FIG. 12B shows a reversed structure of the self-emitting layer. The current controlling TFT 2601 is formed same as the structure of p-channel TFT 702 shown in FIG. 9. See Embodiment 1 about the manufacturing process. The transparent conductive film is used as a pixel electrode (anode) 50 in this embodiment.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

[Embodiment 6]

The TFTs formed by this invention can be used in a variety of electro-optical devices (typically, active matrix-type liquid crystal display, etc.). That is, the invention can be applied to every electronic equipment that incorporates the above electro-optical device and semiconductor circuit as parts.

Examples of the electronic equipment include video cameras, digital cameras, projectors (rear type or front type), head mount displays (goggle-type display), car navigation systems, car stereo systems, personal computers, portable data terminals (mobile computers, cellular phones, electronic books, etc.) and the like. Their examples are shown in FIGS. 14A to 16C.

Figure 14A:
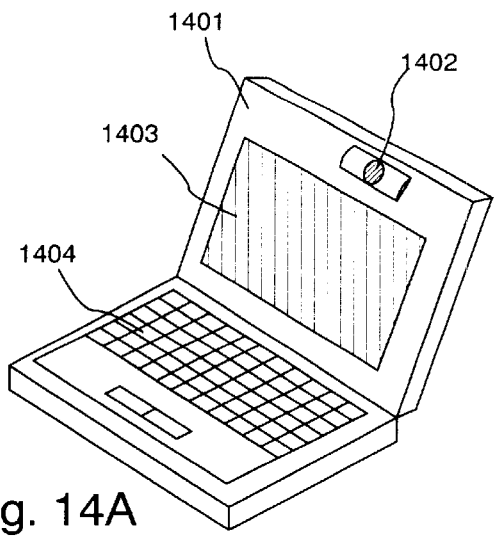
FIGS. 14A to 14F are views showing various semiconductor devices of embodiment 6.

FIG. 14A illustrates a personal computer which includes a main body 1401, a picture input unit 1402, a display unit 1403, a keyboard 1404 and the like. The invention can be applied to the picture input unit 1402, to the display unit 1403 and to any other signal control circuit.

Figure 14B:
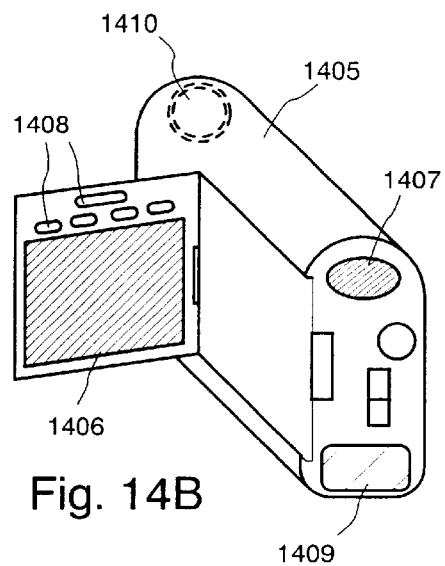

FIG. 14B illustrates a video camera which includes a main body 1405, a display unit 1406, a voice input unit 1407, operation switches 1408, a battery 1409, a receiving unit 1410 and the like. The invention can be applied to the display unit 1406 and to any other signal control circuit.

Figure 14C:
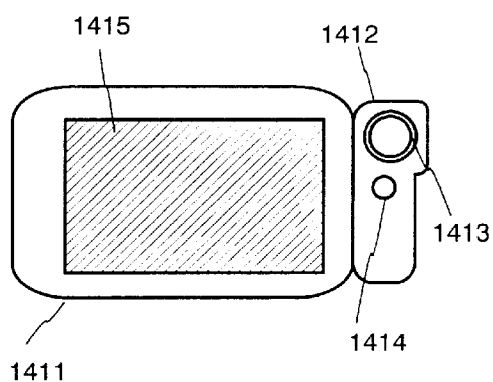

FIG. 14C illustrates a mobile computer which includes a main body 1411, a camera unit 1412, a receiving unit 1413, operation switches 1414, a display unit 1415 and the like. The invention can be applied to the display unit 1415 and to any other signal control circuit.

Figure 14D:
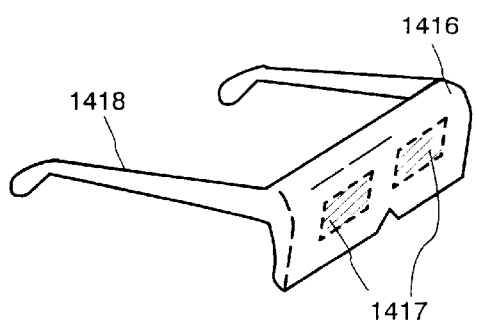

FIG. 14D illustrates a goggle-type display which includes a main body 1416, a display unit 1417, an arm unit 1418 and the like. The invention can be applied to the display unit 1417 and to any other signal control circuit.

Figure 14E:
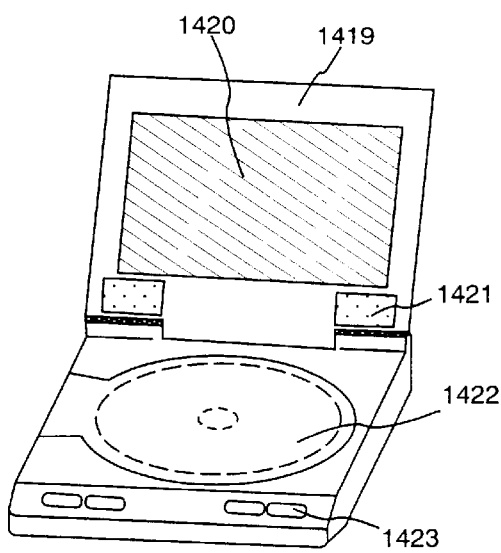

FIG. 14E illustrates a player using a recording medium (hereinafter referred to as recording medium) recording programs and including a main body 1419, a display unit 1420, a speaker unit 1421, a recording medium 1422, operation switches 1423 and the like. The player uses DVD (digital versatile disc), CD, etc. as a recording medium, and makes it possible to listen to music, watch movies, play games and carry out communication through an internet. The invention can be applied to the display unit 1420 and to any other signal control circuit.

Figure 14F:
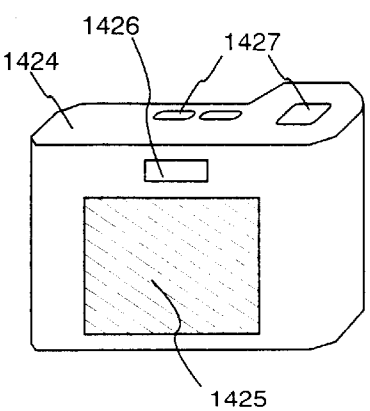

FIG. 14F illustrates a digital camera which includes a main body 1424, a display unit 1425, an eyepiece 1426, operation switches 1427, a receiving unit (not shown) and the like. The invention can be applied to the display unit 1425 and to any other signal control circuit.

Figures 15A, 15B:
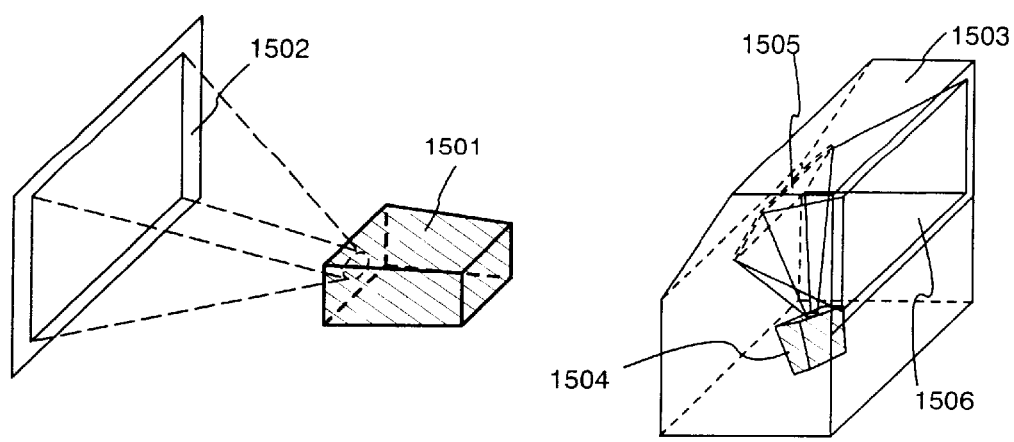
FIGS. 15A to 15D are views showing various semiconductor devices of the embodiment 6.

FIG. 15A is a front-type projector which includes a projector unit 1501, a screen 1502 and the like. The invention can be applied to a liquid crystal display device 1514 constituting a portion of the projector device 1501 and to any other signal control circuit.

FIG. 15B is a rear-type projector which includes a main body 1503, a projector unit 1504, a mirror 1505, a screen 1506 and the like. The invention can be applied to a liquid crystal display device 1514 constituting a portion of the projector unit 1504 and to any other signal control circuit.

Figure 15C:
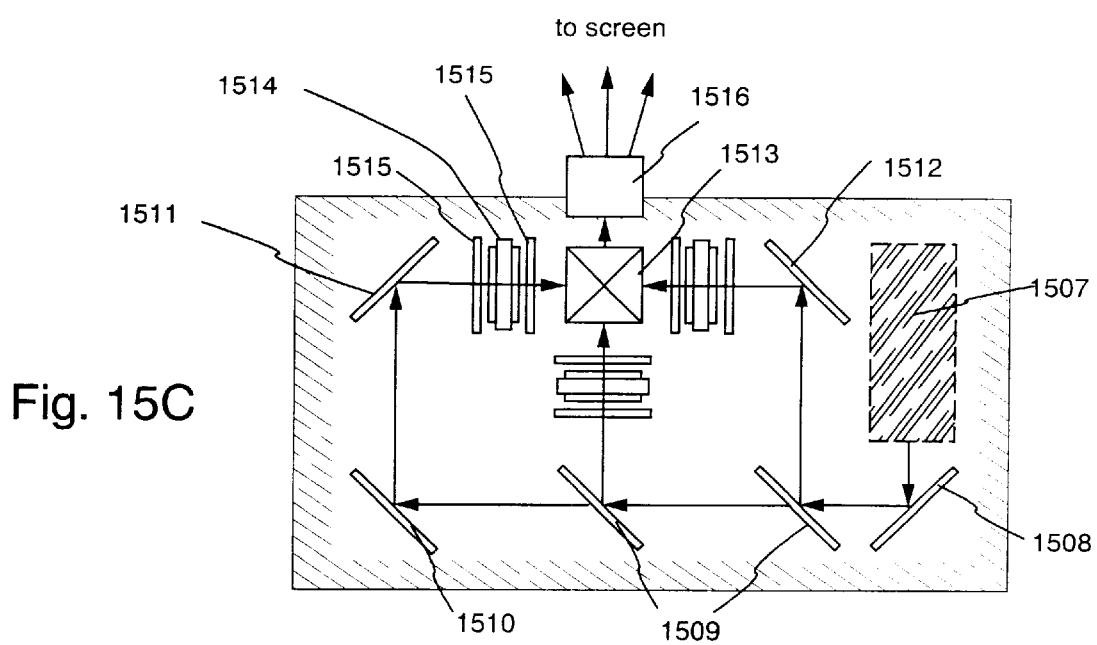

FIG. 15C is a view illustrating structures of the projector units 1501 and 1504 in FIGS. 15A and 15B. The projector units 1501 and 1504 are constituted by a light source optical system 1507, mirrors 1508, 1510 to 1512, dichroic mirrors 1509, a prism 1513, a liquid crystal display device 1514, a phase difference plate 1515, and a projection optical system 1516. The projection optical system 1516 is constituted by an optical system that includes a projection lens. This Embodiment deals with the structure of a three-plate type which, however, is not to limit the invention and may, for example, be a single-plate type. A person who implements the invention may suitably provide an optical system, such as an optical lens, a film having a polarizing function, a film for adjusting the phase difference or an IR film in the optical paths indicated by arrows in FIG. 15C.

Figure 15D:
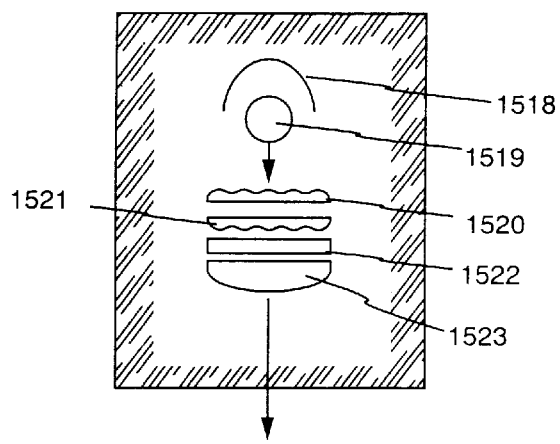

FIG. 15D is a view illustrating a structure of the light source optical system 1507 in FIG. 15C. In this Embodiment, the light source optical system 1507 is constituted by reflectors 1518, a source of light 1519, lens arrays 1520, 1521, a polarizer/conversion element 1522 and a focusing lens 1523. The light source optical system shown in FIG. 15D is only an example which in no way limits the invention. For example, a person who implements the invention may suitably provide an optical system, such as an optical lens, a film having a polarizing function, a film for adjusting the phase difference or an IR film in the optical paths of the source of light.

Here, the projector shown in FIG. 15 uses an electro-optical device of the transmission type, and the electro-optical device of the reflection type is not diagramed here.

Figure 16A:
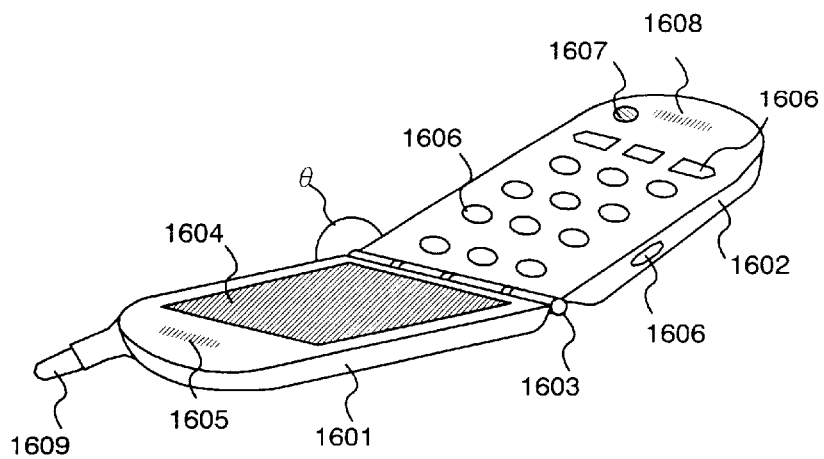
FIGS. 16A to 16C are views showing various semiconductor devices of the embodiment 6.

FIG. 16A illustrates a cellular telephone which includes a display panel 1601, a operation panel 1602, a connection portion 1603, a sensor built-in display 1604, a voice output portion 1605, an operation key 1606, a power source switch 1607, a voice input portion 1608 and an antenna 1609 and the like. The invention can be applied to the sensor built-in display 1604, voice output unit 1605, voice input unit 1608 and any other signal control circuit.

Figure 16B:
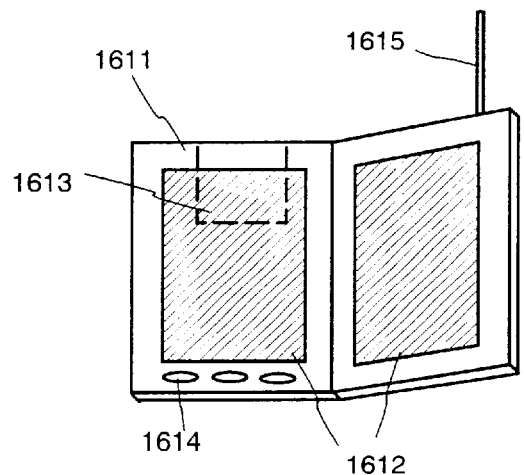

FIG. 16B illustrates a portable book (electronic dictionary) which includes a main body 1611, a display unit 1612, a storage medium 1613, operation switches 1614, an antenna 1615 and the like. The invention can be applied to display units 1612, a storage medium 1613 and any other signal circuit.

Figure 16C:
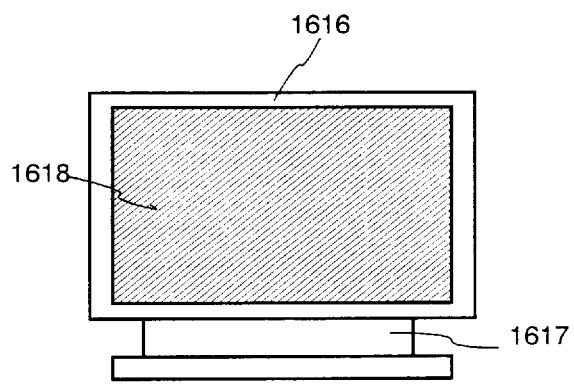

FIG. 16C illustrates a display which includes a main body 16126 a support plate 1617, a display unit 1618 and the like. The invention can be applied to the display unit 1614. The display of this invention is particularly advantageous when it is designed to have a large screen and when the diagonal is not smaller than 10 inches (particularly, not smaller than 30 inches).

As described above, the invention can be used over a very wide range and can be applied to electronic equipment of every field.

According to the present invention, since the contamination of the surface of a film constituting a TFT due to an atmosphere can be prevented, the fluctuation of TFT characteristics can be made low, and the reliability of the TFT can be improved. Besides, an uneven display of an EL display device which is greatly influenced by the fluctuation of TFT characteristics, because of current driving, can be reduced.

Moreover, by carrying out a doping treatment prior to crystallization, it is possible to prevent the crystal structure from being broken, so that the crystallinity of a crystalline semiconductor layer becomes excellent, and high speed processing of an image etc., high speed communication, or the like becomes possible.

What is claimed is:

1. A method of manufacturing a semiconductor device comprising the steps of:

a first step of forming a base film on a substrate;

a second step of forming an amorphous semiconductor film on said base film;

a third step of adding a catalytic element for promoting crystallization to a surface of said semiconductor film; and a fourth step of forming an insulating film on said amorphous semiconductor film after said third step, wherein said first through said fourth steps are continuously conducted without being exposed to an air.

2. A method according to claim 1, wherein said semiconductor device is an electro-luminescence display device.

3. A method according to, claim 1, wherein said semiconductor device is at least one selected from the group consisting of a video camera, a digital camera, a projector, a head-mount display, a car navigation system, a personal computer, a player using a recording medium, a portable book, and a mobile telephone.

4. A method of manufacturing a semiconductor device comprising the steps of:

a first step of forming a base film on a substrate;

a second step of forming an amorphous semiconductor film on said base film;

a third step of adding a catalytic element for promoting crystallization to a surface of said amorphous semiconductor film;

a fourth step of forming an insulating film on said amorphous semiconductor film after said third step;

a fifth step of adding an impurity element to said amorphous semiconductor film;

a sixth step of crystallizing said amorphous semiconductor film by a heat treatment after said fifth step;

a seventh step of removing a contaminant impurity on a surface of a crystallized semiconductor; and a eighth step of irradiating said crystallized semiconductor film with a laser beam after said seventh step, wherein said first through said fourth steps are continuously conducted without being exposed to an air, and wherein said seventh step and said eighth step are continuously conducted.

5. A method according to claim 4, wherein said step of removing said contaminant impurity is conducted in an acid solution containing fluorine.

6. A method according to claim 4, wherein said step of removing said contaminant impurity is conducted in an acid solution containing fluorine, after washing by pure water in which ozone is dissolved.

7. A method according to claim 4, wherein said contaminant impurity is one element or a plurality of elements existing in an air.

8. A method according to claim 4, wherein said semiconductor device is an electro-luminescence display device.

9. A method according to claim 4, wherein said semiconductor device is one selected from the group consisting of a video camera, a digital camera, a projector, a head-mount display, a car navigation system, a personal computer, a player using a recording medium, a portable book, and a mobile telephone.

10. A method of manufacturing a semiconductor device comprising the steps of:

a first step of forming a base film on a substrate;

a second step of forming an amorphous semiconductor film on said base film;

a third step of adding a catalytic element for promoting crystallization to a surface of said amorphous semiconductor film;

a fourth step of forming an insulating film on said amorphous semiconductor film after said third step;

a fifth step of crystallizing said amorphous semiconductor film by a heat treatment;

a sixth step of adding an impurity element to a crystallized semiconductor film;

a seventh step of removing a contaminant impurity on a surface of said crystallized semiconductor film; and a eighth step of irradiating said crystallized semiconductor film after said seventh step, wherein said first through said fourth steps are continuously conducted without being exposed to an air, and wherein said seventh step and said eighth step are continuously conducted.

11. A method according to claim 10, wherein said step of removing said contaminant impurity is conducted in an acid solution containing fluorine.

12. A method according to claim 10, wherein said step of removing said contaminant impurity is conducted in an acid solution containing fluorine, after washing by pure water in which ozone is dissolved.

13. A method according to claim 10, wherein said contaminant impurity is one element or a plurality of elements existing in an air.

14. A method according to claim 10, wherein said semiconductor device is an electro-luminescence display device.

15. A method according to claim 10, wherein said semiconductor device is one selected from the group consisting of a video camera, a digital camera, a projector, a head-mount display, a car navigation system, a personal computer, a player using a recording medium, a portable book, and a mobile telephone.

16. A method of manufacturing a semiconductor device comprising the steps of:

a first step of forming a base film on a substrate;

a second step of forming an amorphous semiconductor film on said base film;

a third step of adding a catalytic element for promoting crystallization to a surface of said semiconductor film;

a fourth step of forming an insulating film on said amorphous semiconductor film after said third step; and a fifth step of crystallizing said amorphous semiconductor film by a heat treatment, wherein said first through said fourth steps are continuously conducted without being exposed to an air.

17. A method according to claim 16, wherein said semiconductor device is an electro-luminescence display device.

18. A method according to claim 16, wherein said semiconductor device is at least one selected from the group consisting of a video camera, a digital camera, a projector, a head-mount display, a car navigation system, a personal computer, a player using a recording medium, a portable book, and a mobile telephone.

19. A method of manufacturing a semiconductor device comprising the steps of:

a first step of forming a base film on a substrate;

a second step of forming an amorphous semiconductor film on said base film;

a third step of adding a catalytic element for promoting crystallization to a surface of said amorphous semiconductor film;

a fourth step of forming an insulating film on said amorphous semiconductor film after said third step; and a fifth step of adding an impurity element to said amorphous semiconductor film, wherein said first through said fourth steps are continuously conducted without being exposed to an air.

20. A method according to claim 19, wherein said semiconductor device is an electro-luminescence display device.

21. A method according to claim 19, wherein said semiconductor device is one selected from the group consisting of a video camera, a digital camera, a projector, a head-mount display, a car navigation system, a personal computer, a player using a recording medium, a portable book, and a mobile telephone.

22. A method of manufacturing a semiconductor device comprising the steps of:

a first step of forming a base film on a substrate;

a second step of forming an amorphous semiconductor film on said base film;

a third step of adding a catalytic element for promoting crystallization to a surface of said amorphous semiconductor film;

a fourth step of forming an insulating film on said amorphous semiconductor film after said third step;

a fifth step of crystallizing said amorphous semiconductor film by a heat treatment; and a sixth step of adding an impurity element to a crystallized semiconductor film, wherein said first through said fourth steps are continuously conducted without being exposed to an air.

23. A method according to claim 22, wherein said semiconductor device is an electro-luminescence display device.

24. A method according to claim 22, wherein said semiconductor device is one selected from the group consisting of a video camera, a digital camera, a projector, a head-mount display, a car navigation system, a personal computer, a player using a recording medium, a portable book, and a mobile telephone.

* * * * *

UNITED STATES PATENT AND TRADEMARK OFFICE
CERTIFICATE OF CORRECTION

PATENT NO.        : 6,506,636 B2                                    Page 1 of 1
APPLICATION NO.   : 09/851492
DATED             : January 14, 2003
INVENTOR(S)       : Shunpei Yamazaki et al.

It is certified that error appears in the above-identified patent and that said Letters Patent is hereby corrected as shown below:

TITLE PAGE
(73) Assignee: "le;.5qSemiconductor Energy Laboratory Co., Ltd. (JP)" should read
--Semiconductor Energy Laboratory Co., Ltd. (JP)--.

Signed and Sealed this

Twenty-second Day of August, 2006

JON W. DUDAS
*Director of the United States Patent and Trademark Office*